United States Patent
Uzu et al.

(10) Patent No.: US 9,761,752 B2
(45) Date of Patent: Sep. 12, 2017

(54) SOLAR CELL, SOLAR CELL MODULE, METHOD FOR MANUFACTURING SOLAR CELL, AND METHOD FOR MANUFACTURING SOLAR CELL MODULE

(71) Applicant: KANEKA CORPORATION, Osaka-shi, Osaka (JP)

(72) Inventors: Hisashi Uzu, Ibaraki (JP); Daisuke Adachi, Kusatsu (JP)

(73) Assignee: Kaneka Corporation, Osaka-shi, Osaka (JP)

( * ) Notice: Subject to any disclaimer, the term of this patent is extended or adjusted under 35 U.S.C. 154(b) by 0 days.

(21) Appl. No.: 14/892,456

(22) PCT Filed: May 20, 2014

(86) PCT No.: PCT/JP2014/063386
§ 371 (c)(1),
(2) Date: Nov. 19, 2015

(87) PCT Pub. No.: WO2014/189058
PCT Pub. Date: Nov. 27, 2014

(65) Prior Publication Data
US 2016/0126406 A1    May 5, 2016

(30) Foreign Application Priority Data
May 21, 2013  (JP) .................. 2013-107394

(51) Int. Cl.
*H01L 51/00* (2006.01)
*H01L 31/18* (2006.01)
(Continued)

(52) U.S. Cl.
CPC .... *H01L 31/1884* (2013.01); *H01L 31/02167* (2013.01); *H01L 31/02168* (2013.01);
(Continued)

(58) Field of Classification Search
CPC ................................. H01L 21/76805
See application file for complete search history.

(56) References Cited

U.S. PATENT DOCUMENTS

| 4,586,988 A | 5/1986 | Nath et al. | |
|---|---|---|---|
| 2003/0192583 A1* | 10/2003 | Ryan ................... | H01G 9/2031 136/244 |

(Continued)

FOREIGN PATENT DOCUMENTS

| JP | S6066426 A | 4/1985 |
|---|---|---|
| JP | H04504033 A | 7/1992 |

(Continued)

OTHER PUBLICATIONS

ISA Japanese Patent Office, International Search Report Issued in Application No. PCT/JP2014/063386, Jul. 1, 2014, WIPO, 4 pages.

(Continued)

*Primary Examiner* — Robert Vetere
(74) *Attorney, Agent, or Firm* — Alleman Hall Creasman & Tuttle LLP

(57) ABSTRACT

An electrode layer formation step of forming an electrode layer including the first electrode and a removal-target body on a first main surface side of a photoelectric conversion part; an insulating layer formation step of forming an insulating layer so as to cover at least the removal-target body; an opening formation step of forming an opening in the insulating layer by utilizing the removal-target body; and a metal layer formation step of forming a metal layer on the electrode layer through the opening of the insulating layer by a plating method are performed in this order. In the opening formation step, at least a part of the removal-target body is removed by irradiation by a laser beam, so that the opening of the insulating layer is formed.

8 Claims, 13 Drawing Sheets

(51) Int. Cl.
  *H01L 31/0216* (2014.01)
  *H01L 31/0224* (2006.01)
  *H01L 31/0747* (2012.01)

(52) U.S. Cl.
  CPC .. *H01L 31/022425* (2013.01); *H01L 31/0747* (2013.01); *Y02E 10/50* (2013.01)

(56) References Cited

U.S. PATENT DOCUMENTS

2012/0291844 A1* 11/2012 Tsuge ................ H01L 31/02242
                                                                        136/244
2013/0247957 A1   9/2013 Hashigami et al.

FOREIGN PATENT DOCUMENTS

| JP | H04348569 A | 12/1992 |
| JP | 2000058885 A | 2/2000 |
| JP | 2000058888 A | 2/2000 |
| JP | 2010098232 A | 4/2010 |
| JP | 2011199045 A | 10/2010 |
| JP | 2012160769 A | 8/2012 |
| JP | 2013507781 A | 3/2013 |
| WO | 9108584 A1 | 6/1991 |
| WO | 2010123980 A1 | 10/2010 |
| WO | 2011045287 A1 | 4/2011 |
| WO | 2012030019 A1 | 3/2012 |
| WO | 2012030407 A1 | 3/2012 |
| WO | 2012077567 A1 | 6/2012 |

OTHER PUBLICATIONS

International Bureau of WIPO, International Preliminary Report on Patentability Issued in Application No. PCT/JP2014/063386, May 20, 2014, WIPO, 6 pages.
European Patent Office, Supplementary European Search Report Issued in Application No. 14800502, Search Completed Dec. 21, 2016, Berlin, Germany, 2 pages.

* cited by examiner

A-A SECTIONAL VIEW

B-B SECTIONAL VIEW

B-B SECTIONAL VIEW

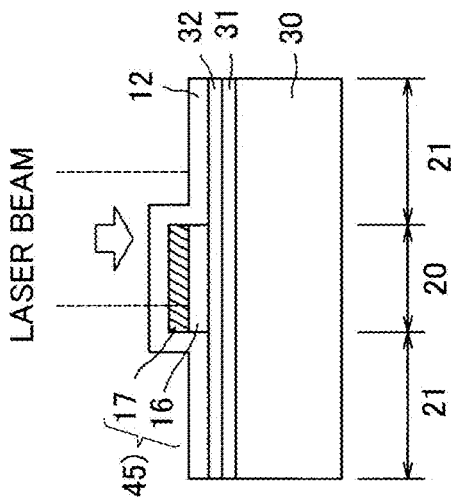
FIG. 6(a)
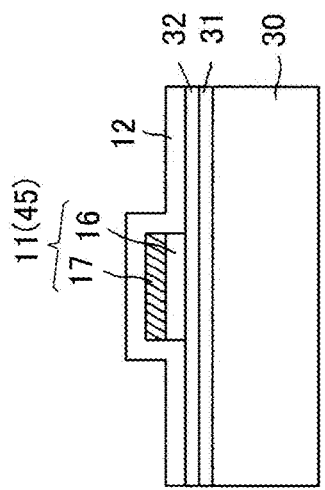
FIG. 6(b)
FIG. 6(c)
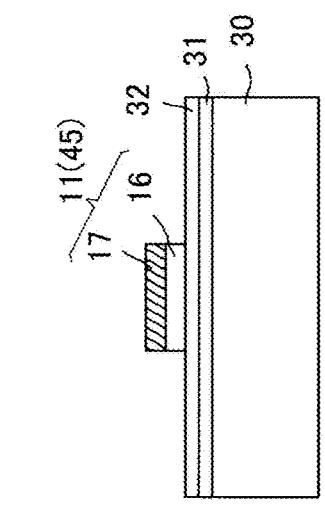
FIG. 6(d)
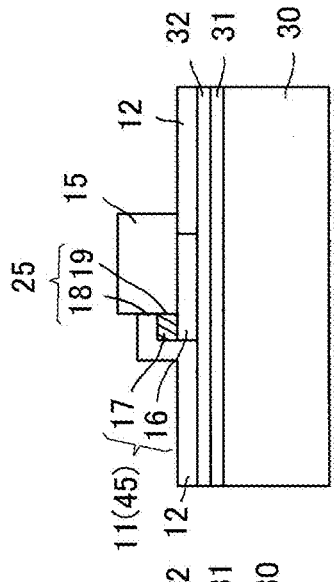
FIG. 6(e)
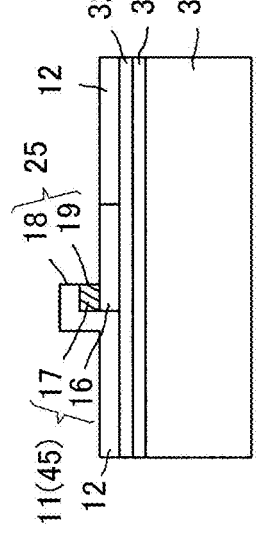

B-B SECTIONAL VIEW

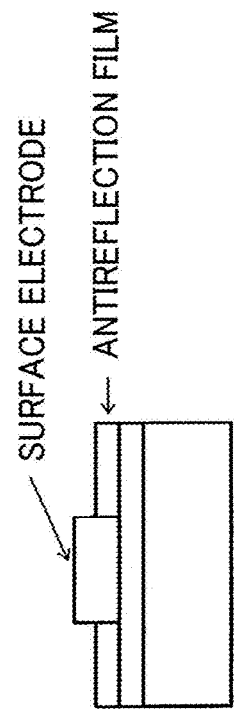
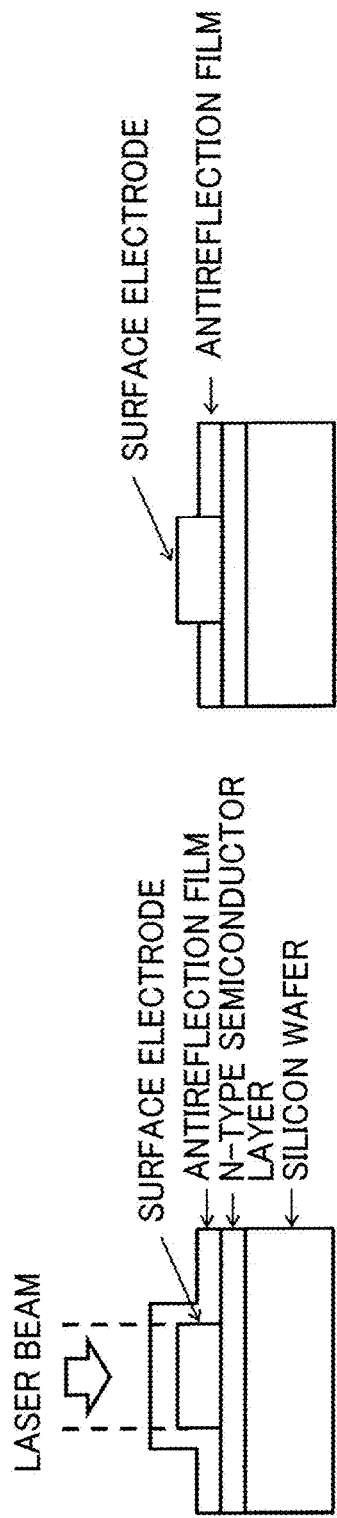
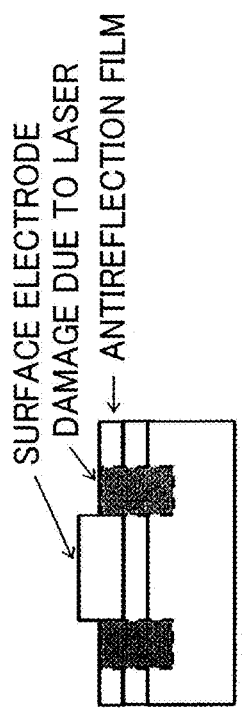
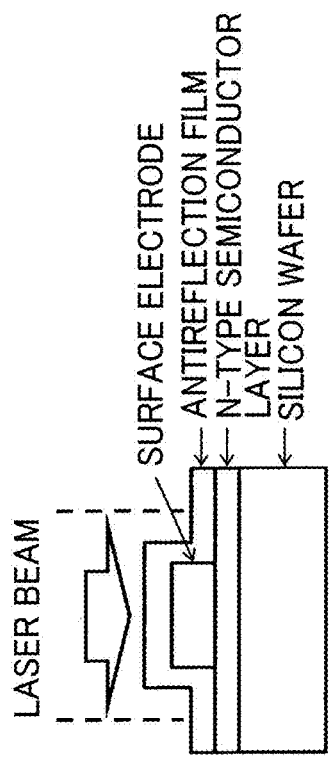

SOLAR CELL, SOLAR CELL MODULE, METHOD FOR MANUFACTURING SOLAR CELL, AND METHOD FOR MANUFACTURING SOLAR CELL MODULE

TECHNICAL FIELD

The present invention relates to a solar cell, a solar cell module, a method for manufacturing a solar cell, and a method for manufacturing a solar cell module.

BACKGROUND ART

Recently, as energy problems, or global environmental problems become more serious, solar cells are attracting attention as alternative energy, replacing fossil fuel.

In this solar cell, light is applied to a photoelectric conversion part formed by a semiconductor junction or the like, to generate carriers (electrons and electron holes). Then, the generated carriers are extracted to an external circuit, thereby generating electric power. On the photoelectric conversion part of this solar cell, a collector electrode is provided in order to effectively extract the carriers generated by the photoelectric conversion part, to the external circuit.

Examples of the solar cell include, for example, a crystal silicon-based solar cell using a single crystal silicon substrate or a polycrystal silicon substrate. In this crystal silicon-based solar cell, a collector electrode made of thin metal is provided on a light-receiving surface.

Additionally, examples of the solar cell include a heterojunction solar cell having an amorphous silicon layer and a transparent electrode layer on a crystal silicon substrate. Also in the heterojunction solar cell, a collector electrode is provided on the transparent electrode layer.

Generally, the collector electrode of the above solar cell is often formed by printing a silver paste material in a predetermined pattern by a screen printing method. However, this method has a problem that a material cost for silver increases, while the process itself is simple. Additionally, in this method, a silver paste material containing a resin is used, and therefore there is a problem that the resistivity of the collector electrode is higher compared to a case of using a pure metal. Therefore, in the case of forming a collector electrode by using the silver paste material, it is necessary to print the silver paste material thick, in order to reduce the resistivity of the collector electrode. This causes a problem, in that manufacturing cost increases. When the printing thickness increases, the line width of the formed collector electrode also increases. Therefore, it is difficult to thin the electrode, and there is another problem that a shading loss due to the collector electrode increases.

As a method for solving theses problems, there is known a method for forming a collector electrode by a plating method. This plating method is generally more excellent than a printing method in material cost and cost in manufacturing (process cost).

For example, Patent Documents 1 to 3 each disclose a method for producing a solar cell in which a metal layer made of copper or the like is formed on a transparent electrode configuring a photoelectric conversion part by a plating method.

The method for producing a collector electrode disclosed in Patent Document 1 will be described. First, a resist material layer (insulating layer) having an opening corresponding to the shape of a collector electrode is formed on a transparent electrode layer of a photoelectric conversion part. Then, a metal layer is formed by electroplating in the resist opening of the transparent electrode layer. Thereafter, a collector electrode having a predetermined shape is formed by removing the resist.

Patent Document 3 discloses that the line width of a plating electrode layer is made to be not larger than the line width of a base electrode layer by forming a plating electrode layer by using a mask after the formation of the base electrode layer.

Additionally, Patent Document 3 discloses that a plating solution adhered to a substrate is cleaned and removed by water, an organic solvent, and the like after a plating step, in view of a problem that when a solar cell having the remaining plating solution is exposed to a high temperature and high humidity environment, a solar cell property is deteriorated.

In Patent Document 4, after a translucent insulating layer of silicon dioxide (Sift) or the like is provided on a transparent conductive film, a groove that passes through the translucent insulating layer is provided and the surface or the side surface of the transparent conductive film is exposed. Patent Document 4 discloses a method for forming a metal collector electrode so as to be electrically connected with an exposed part of the transparent conductive film.

Specifically, Patent Document 4 proposes a method for forming a metal seed in the exposed part of the transparent conductive film by a light plating method or the like, and forming a metal collector electrode by electroplating with this metal seed as a starting point.

This method described in Patent Document 4 does not need the use of a resist unlike Patent Document 1. Therefore, the method described in Patent Document 4 has an advantage over the method described in Patent Document 1 in material cost and process cost. Additionally, in the method described in Patent Document 4, a low-resistance metal seed is provided, so that it is possible to reduce contact resistance between the transparent conductive film and the metal collector electrode.

In Patent Document 5, unevenness of a conductive seed is enlarged. Consequently, when an insulating layer is formed, the whole surface of a part except the conductive seed of a photoelectric conversion part is covered, thereby forming a discontinuous opening on the conductive seed. Patent Document 5 describes the formation of a plating layer through this opening.

In addition to the above, there are Patent Documents 6 and 7 as a prior art related to the present invention.

PRIOR ART DOCUMENTS

Patent Documents

Patent Document 1: JP S60-66426 A
Patent Document 2: JP 2000-58885 A
Patent Document 3: JP 2010-98232 A
Patent Document 4: JP 2011-199045 A
Patent Document 5: JP 2013-507781 A
Patent Document 6: JP H4-348569 A
Patent Document 7: JP H4-504033 A

DISCLOSURE OF INVENTION

Technical Problem

The above method described in Patent Document 3 enables the thinning of the plating electrode layer by the mask. However, in a case where the mask corresponding to the collector electrode pattern is used as described in Patent Document 3, a large cost for producing the mask, and many man-hours are required, thereby causing a problem that the method is unsuitable for practical uses.

According to the above method described in Patent Document 4, it is possible to form the collector electrode having a thin line pattern by a plating method without using an expensive resist material. A method for forming a metal seed taken as a starting point of electrolytic plating by a light plating method as described in Patent Document 4 can be applied to an n-layer side of a semiconductor junction. However, the method cannot be applied to a p-layer side of the semiconductor junction.

Herein, it is generally known that the heterojunction solar cell uses an n-type single crystal silicon substrate, and exhibits the highest property with a configuration in which a heterojunction on the p-layer side is defined as a light incident side.

However, the method described in Patent Document 4 cannot be applied to the p-layer side as described above, and therefore there is a problem that the method is not suitable for the formation of a collector electrode on a light incident side in a heterojunction solar cell that has a light incident side on a p-layer side.

In Patent Document 4, the side surface of the transparent electrode layer and the metal collector electrode are in contact with each other in the groove that passes through the insulating layer and the transparent electrode layer. However, the thickness of the transparent electrode layer is generally about 100 nm, and therefore the contact area between the side surface and the metal collector electrode is small. This causes a problem that the whole resistance between the transparent electrode layer and the collector electrode increases, and collector electrode function cannot be sufficiently exerted.

In Patent Document 5, a conductive paste having large unevenness is used. Therefore, the plating layer is formed by being buried in the conductive paste. When the plating solution penetrates the conductive paste, there is a risk that the conductive paste is peeled from a conductive substrate (photoelectric conversion part). Therefore, it is conceivable that the reliability of a formed solar cell is lowered.

As described above, in the conventional techniques, the formation of the collector electrode by the plating method is proposed as an alternate of the formation of the collector electrode by the screen printing method, but no such proposal has proved effective for practical use in a solar cell.

The present invention solves the problems of the conventional techniques related to the formation of the collector electrode of the solar cell as described, and an object of the present invention is to improve the conversion efficiency of the solar cell, and to reduce the manufacturing cost of the solar cell. Additionally, it is an object to provide a solar cell module using these solar cells, and a manufacturing method therefor.

Solution to Problem

As a result of intensive studies made in view of the above problems by the present inventors, it has been found that the conversion efficiency of the solar cell can be improved by using a predetermined collector electrode, and the collector electrode can be formed at a low cost, thus achieving the present invention.

An aspect of the present invention is a method for manufacturing a solar cell having at least a first electrode, a metal layer, and an insulating layer on a first main surface side of a photoelectric conversion part formed in a planar shape, the method including: an electrode layer formation step of forming an electrode layer including the first electrode and a removal-target body on the first main surface side of the photoelectric conversion part; an insulating layer formation step of forming the insulating layer on the first main surface side of the photoelectric conversion part so as to cover at least the removal-target body; an opening formation step of forming an opening in the insulating layer by utilizing the removal-target body; and a metal layer formation step of forming the metal layer on the electrode layer through the opening of the insulating layer by a plating method, in this order, wherein in the opening formation step, at least a part of the removal-target body is removed by irradiation by a laser beam, so that the opening of the insulating layer is formed.

The "main surface" mentioned herein is a surface that substantially planarly extends, and fine unevenness on the surface does not matter.

For example, in a case where the photoelectric conversion part has a texture structure, countless unevennesses are formed on the surface of the photoelectric conversion part. The main surface in this case does not indicate each inclined surface of the texture structure, but indicates an expansively extending plane when viewed as a whole.

According to this aspect, in the opening formation step, at least a part of the removal-target body is removed by the irradiation by the laser beam, so that the opening of the insulating layer is formed, and hence a plating solution can be brought into contact with the electrode layer from the outside of the insulating layer. Therefore, it is possible to form the metal layer by a plating method while suppressing deterioration in performance of the photoelectric conversion part.

According to this aspect, the opening is formed in the insulating layer by utilizing the removal-target body. Therefore, even when the insulating layer is made of a material for transmitting most of a laser beam, the opening can be formed.

Generally, a transparent electrode layer is disposed on the surface on the light incident side of the photoelectric conversion part in order to introduce light inside the photoelectric conversion part to extract electricity converted from the light in the inside. This transparent electrode layer is often formed of a transparent conductive oxide such as indium tin oxide (ITO). It is known that when this transparent conductive oxide such as ITO is exposed to the plating solution, performance is deteriorated due to erosion.

In a preferable aspect, the photoelectric conversion part is provided with a transparent electrode layer on an outermost surface on the first main surface side, and in the insulating layer formation step, the insulating layer is formed such that a major part of an outer surface of the transparent electrode layer is not exposed and the outer surface is with respect to the photoelectric conversion part.

The "major part" mentioned herein means that not less than 80 percent and not more than 100 percent of a reference surface is covered.

According to this aspect, in the insulating layer formation step, the insulating layer is formed such that the major part of the outer surface of the transparent electrode layer is not exposed. Therefore, even when the transparent electrode layer is formed of a transparent conductive oxide such as ITO, the transparent electrode layer is unlikely to be eroded in the plating step, and it is possible to prevent deterioration in the performance of the photoelectric conversion part.

According to a preferable aspect, the removal-target body is electroconductive.

According to this aspect, electric conduction between the electrode layer and the metal layer is enabled even when the removal-target body is not completely removed in the opening formation step. That is, electric conduction is enabled even when the removal-target body covers outside the first electrode.

In Patent Document 6, a grid-like surface electrode is formed before an antireflection film is formed, and thereafter, the antireflection film is formed on the whole surface including the surface electrode. Next, a laser is applied onto the surface electrode, thereby forming an opening. A method for forming a solder layer on an opening formation part on the surface electrode by immersing the film in a solder solution in this state is introduced.

In this method of Patent Document 6, when a laser beam is made to irradiate to the photoelectric conversion part of the solar cell, there is a possibility that the photoelectric conversion part is damaged. Therefore, the laser beam needs to be irradiated only to the grid-like surface electrode. However, there is a problem that the positioning for irradiating the laser beam only to the grid-like surface electrode is difficult, and process time increases.

According to a preferable aspect, the laser beam is made to irradiate with output that does not substantially influence the photoelectric conversion part.

One index representing the "Output that does not substantially influence the photoelectric conversion part" mentioned herein is, for example, output with which reduction of life time of an laser beam irradiated portion of an object is less than 20 percent after a laser beam is made to irradiate to the object.

However, it is difficult to exactly measure lifetime, and lifetime cannot be always be correctly measured.

Therefore, even when measured lifetime largely reduces, it can be said that the output does not influence the photoelectric conversion part as long as the reduction of an open-circuit voltage (Voc) is within an allowable range. Specifically, in a case where the Voc is reduced by only 3 percent or less after the irradiation by the laser beam from that before the irradiation, it can be said that the output does not influence the photoelectric conversion part.

According to this aspect, the solar cell is manufactured by the irradiation by the laser beam adjusted to the output that does not substantially influence the photoelectric conversion part, and therefore even when the laser beam is made to irradiate to the photoelectric conversion part beyond the electrode layer, the performance of the photoelectric conversion part is hardly deteriorated. Therefore, it is possible to form an opening without precisely adjusting a laser beam irradiation position like Patent Document 6. Therefore, according to this aspect, it is possible to shorten the manufacturing time, and to improve productivity.

From another viewpoint, influence on the photoelectric conversion part is small, and therefore it is possible to intentionally increase the spot diameter of a laser beam and irradiate the laser beam. Therefore, it is possible to easily control the formation area of the metal layer.

According to a more preferable aspect, in the opening formation step, an electrode layer formation area where the electrode layer is formed, and an electrode layer non-formation area other than the electrode layer formation area are present when the photoelectric conversion part is planarly viewed, and the laser beam is made to irradiate including the electrode layer formation area and the electrode layer non-formation area.

According to this aspect, in the opening formation step, the laser beam is intentionally irradtated including the electrode layer formation area and the electrode layer non-formation area, and therefore removal up to the ends of the electrode layer can be attained.

Additionally, one end of the electrode layer is excluded from a laser beam irradiation range, so that the formation range of the metal layer can be intentionally provided close to the other end. Therefore, it is possible to control the width of the metal layer, and to thin the metal layer.

According to a preferable aspect, in the opening formation step, the opening is formed by irradiation by a laser beam having a wavelength of not less than 400 nm and not more than 1500 nm.

When the laser beam has a wavelength in this range, it is possible to reduce influence on the photoelectric conversion part by the laser beam.

In the above aspect, in the opening formation step, the opening may be formed by irradiation by a laser beam having a power density of not less than 100 $\mu W/\mu m^2$ and not more than 1500 $\mu W/\mu m^2$.

According to a preferable aspect, in the opening formation step, at least a part of the removal-target body is removed by the irradiation by the laser beam, and in the plating step, the metal layer is formed so as to be in direct contact with a surface of the first electrode.

According to this aspect, in the plating step, the removal-target body is not interposed between the first electrode and the metal layer, and the metal layer is in direct contact with the surface of the first electrode, and therefore it is possible to suppress a resistance loss during power generation.

In the above aspect, the insulating layer may have transparency, and the opening may be formed in the insulating layer by dissolution or sublimation of the removal-target body in the laser step.

According to this aspect, the opening is formed in the insulating layer by the dissolution or the sublimation of the removal-target body due to the laser beam, and therefore the opening is easily formed.

In the above aspect, in the electrode layer formation step, the first electrode and the removal-target body may be formed on the photoelectric conversion part in this order.

According to this aspect, the removal-target body is located outside the first electrode when seen from the photoelectric conversion part. That is, the photoelectric conversion part is protected by the first electrode, and therefore it is possible to suppress the damage of the photoelectric conversion part accompanying the formation of the opening by the laser beam.

Additionally, according to this aspect, the first electrode and the removal-target body can be formed by separate steps, and therefore the first electrode and the removal-target body can be formed with less impurities.

In the above aspect, in the electrode layer formation step, the first electrode and the removal-target body may be formed on the photoelectric conversion part at the same time by using an inclusive material containing the first electrode and the removal-target body.

According to this aspect, the first electrode and the removal-target body are formed at the same time by using the inclusive material, and therefore it is possible to simplify the process.

In the above aspect, the inclusive material may be directly applied onto the photoelectric conversion part by a printing method.

In the above aspect, the metal layer may be a metal simple substance or alloy.

According to this aspect, the metal layer does not include insulating impurities such as a resin, and therefore the metal layer is a low resistance body.

In the above aspect, the metal layer may have copper (Cu).

In the above aspect, in the opening formation step, the opening of the insulating layer may be formed by irradiation by a second harmonic generation laser or an infrared laser.

The "infrared laser" mentioned herein is a laser that oscillates light in an infrared region, and specifically a laser that oscillates light in a region (infrared region) whose wavelength is longer than 780 nm.

In the above aspect, in the above opening formation step, the opening of the insulating layer may be formed by irradiation by a laser beam of a basic wave having the wavelength in the infrared region or a second harmonic generation laser beam of a basic wave having the wavelength in the infrared region.

In the above aspect, the opening of the insulating layer may be formed by application of a SHG laser having a power density of 100 $\mu W/\mu m^2$ to 1500 $\mu W/\mu m^2$.

In the above aspect, the opening of the insulating layer may be formed by application of an IR laser having a power density of 100 $\mu W/\mu m^2$ to 1500 $\mu W/\mu m^2$.

In the above aspect, the opening of the insulating layer may be formed by irradiation by a laser beam having large intensity distribution.

In the above aspect, the laser beam that forms the opening may be a laser beam whose spot diameter is larger than the width of the removal-target body.

The "spot diameter" mentioned herein is the diameter or the maximum external dimension of an irradiated portion when a laser beam is made to irradiate to an object. For example, in a case where the shape of the laser beam irradiated portion is oval, the "spot diameter" is a long diameter. In a case where the shape of the laser beam irradiated portion is quadrangular, the "spot diameter" is a diagonal line.

An aspect of the present invention is a method for manufacturing a solar cell module including the steps of: forming a solar cell by the above manufacturing method; and using the solar cell.

In the method for manufacturing a solar cell module of this aspect, it is possible to form a solar cell module having improved conversion efficiency compared to a conventional solar cell module. Additionally, according to this aspect, a collector electrode can be formed at a lower cost than a conventional collector electrode.

In the above aspect, a single or a plurality of solar cells are formed by the above manufacture method, and one of the single or the plurality of solar cells may be connected to an external circuit or another solar cell by a wiring member.

The "external circuit" mentioned herein is a circuit disposed outside the solar cell, and is, for example, a power circuit, a mounting circuit, or the like connected to an external power source.

An aspect of the present invention is a solar cell including: an electrode layer; an insulating layer; and a metal layer, the electrode layer, the insulating layer, and the metal layer being disposed on a first main surface side of a photoelectric conversion part extending in a planar fashion, wherein the insulating layer has an opening that passes through in a direction perpendicular to the first main surface of the photoelectric conversion part, the electrode layer includes a first electrode and a removal-target body, and has a hole that extends in the perpendicular direction, the hole is a bottomed hole having a bottom, the opening and the hole form a communication hole for allowing the opening and the hole to communicate with each other, and a part of the metal layer is filled in the communication hole from an outside of the insulating layer and the outside is with respect to the photoelectric conversion part.

According to this aspect, the opening is a through hole, and the hole is a bottomed hole forming the communication hole, and a part of the metal layer is filled in the communication hole from the outside of the insulating layer. That is, the metal layer does not reach the photoelectric conversion part through the communication hole. Therefore, even when the metal layer is formed by a plating method, the photoelectric conversion part is not exposed to a plating solution through the communication hole, and the photoelectric conversion part can be prevented from being eroded by the plating solution.

According to the above aspect, the metal layer may be in contact with the first electrode in the hole.

According to the above aspect, the metal layer may be in contact with the first electrode and the removal-target body in the hole.

According to this aspect, the metal layer is in contact with the first electrode and the removal-target body, and therefore the metal layer is unlikely to be peeled from the hole.

According to a preferable aspect, the communication hole extends in a plane direction on the first main surface side of the photoelectric conversion part, and in a cross-section orthogonal to the extending direction, the communication hole is located at a center in a width direction of the electrode layer.

According to this aspect, the metal layer is filled in the communication hole located at the center of the electrode layer, and therefore a connecting portion between the electrode layer and the metal layer is protected by the insulating layer and the electrode layer. Therefore, the metal layer is unlikely to be peeled from the electrode layer due to an external factor such as vibration.

According to a preferable aspect, the insulating layer has a plurality of openings that pass through in the direction perpendicular to the first main surface of the photoelectric conversion part, the electrode layer has a plurality of holes, the plurality of holes are bottomed holes, each of the plurality of holes and a corresponding one of the openings communicate with each other to form a communication hole, and a part of the metal layer is filled in the communication holes.

According to this aspect, the communication holes are formed at a plurality of locations, and the metal layer is formed in the respective communication holes. Therefore, even when the metal layer filled in one of the holes is peeled, the function as the collector electrode can be secured by the metal layer filled in the other hole.

In the above aspect, the plurality of holes may be different in shape.

In the above aspect, the metal layer may be a plating layer formed by a plating method.

In the above aspect, the photoelectric conversion part may have a silicon-based thin film, and a transparent electrode layer on one main surface of one conductive type crystal silicon substrate in this order, and may have the electrode layer on the transparent electrode layer.

In the above aspect, the electrode layer may have the first electrode and the removal-target body in this order from the transparent electrode layer side.

In the above aspect, 95 percent or more of the whole of the metal layer may be formed of a metal simple substance or metal alloy.

In the above aspect, the metal layer may include copper (Cu) as a main component.

According to this aspect, the metal layer can be formed at a lower cost compared to silver, gold and the like, while having sufficient conductivity as the collector electrode.

In the above aspect, in the opening, an outer opening area and an inner opening area are different from each other when seen from the photoelectric conversion part as a reference, and the outer opening area is larger than the inner opening area.

An aspect of the present invention is a solar cell module including the above solar cell.

The solar cell module of this aspect has improved conversion efficiency compared to a conventional solar cell module, and is further excellent in regard to cost, as compared to the conventional one.

In the above aspect, in the solar cell module including a plurality of above solar cells, at least two sheets of solar cells among the plurality of solar cells may be connected in series or in parallel by a wiring member.

In the above aspect, the solar cell module may have a plurality of protective materials and a sealing material, at least two protective materials among the plurality of protective materials may hold the above solar cells therebetween, and the sealing material may be filled between the two protective materials and the solar cells.

According to this aspect, the solar cells are sealed by the protective materials and the sealing material. Therefore, water or the like can be prevented from entering the photoelectric conversion part.

Effect of Invention

According to the present invention, a collector electrode (an electrode layer and a metal layer) can be formed by a plating method, and therefore the collector electrode (the electrode layer and the metal layer) is reduced in resistance, so that it is possible to improve the conversion efficiency of a solar cell.

Additionally, according to the present invention, the formation of the collector electrode (the electrode layer and the metal layer) can be attained relatively easily at a low cost without using an expensive photoresist.

BRIEF DESCRIPTION OF DRAWINGS

FIG. 6(a) to FIG. 6(e) each are a sectional view schematically showing a method for producing the solar cell module of FIG. 1, and each represent a manufacturing step. Note that a silicon-based thin film, a transparent electrode layer, and a rear surface metal electrode on a rear surface side with respect to a single crystal silicon substrate are not related to the illustrated manufacturing steps, and therefore are omitted.

FIGS. 15(a) and 15(b) each are an explanatory diagram of a crystal silicon solar cell according to another embodiment of the present invention, in which FIG. 15(a) is a sectional view of a substrate after a laser step, and FIG. 15 (b) is a sectional view of a substrate after a rear surface metal formation step.

FIG. 16 is a sectional view schematically showing a method for producing a solar cell according to an embodiment of a conventional technique.

BEST MODE FOR CARRYING OUT THE INVENTION

Hereinafter, a solar cell module of the present invention will be described.

Note that dimensional relations such as thicknesses and lengths in each drawing are suitably changed in order to clarify and simplify the drawings, and actual dimensional relations are not represented.

Unless otherwise stated, a film thickness means a film thickness in a direction perpendicular to a texture inclined plane on a silicon substrate. That is, the film thickness represents an actual average film thickness.

Furthermore, in the following description, inner and outer directions are defined with a photoelectric conversion part as a reference, unless otherwise stated.

Figure 1:
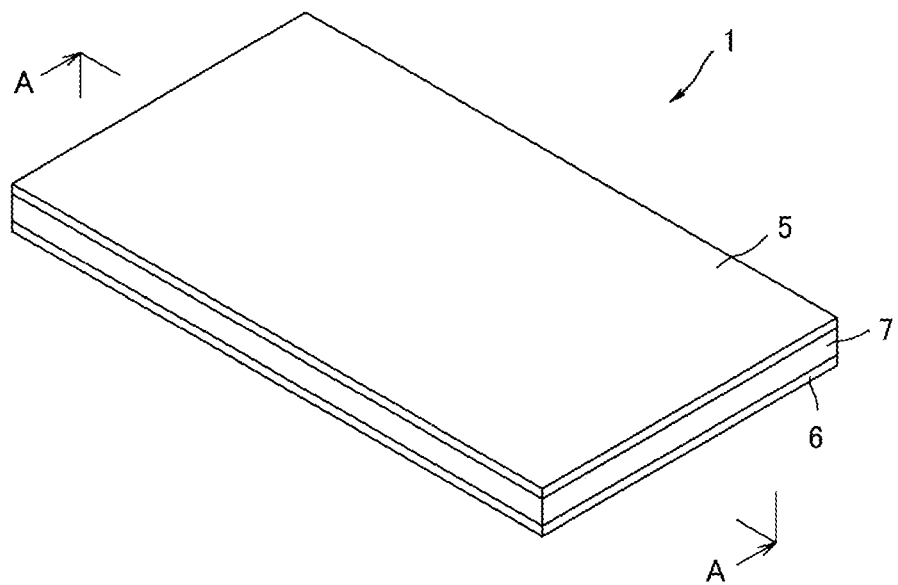
FIG. 1 is a perspective view schematically showing a solar cell module according to a first embodiment of the present invention.
Figure 2:
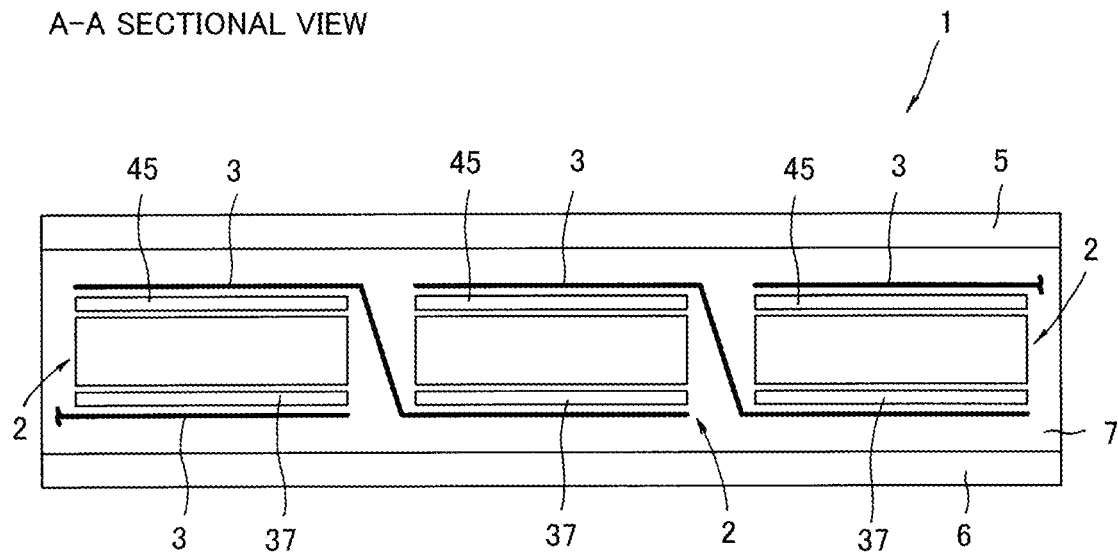
FIG. 2 is an A-A sectional view of the solar cell module of FIG. 1.

As understood from FIG. 1 and FIG. 2, a solar cell module 1 of a first embodiment of the present invention is configured by connecting a plurality of (three in FIG. 2) crystal silicon solar cells 2 in series or in parallel through wiring members 3. As shown in FIG. 2, in the solar cell module 1, two protective materials 5 and 6 hold the plurality of crystal silicon solar cells 2 therebetween, and a sealing material 7 is filled between the protective materials 5 and 6.

The protective materials 5 and 6 each are a protective material that protects the solar cells 2, and each are a plate body having a sealing function such as a waterproof property. As the protective materials 5 and 6, for example, glass substrates or the like can be employed.

The sealing material 7 is filler having a sealing function such as a waterproof property. The sealing material 7 is fluid, and is also an adhesive that adheres the protective materials 5 and 6 to the crystal silicon solar cells 2 by solidification.

Figure 3:
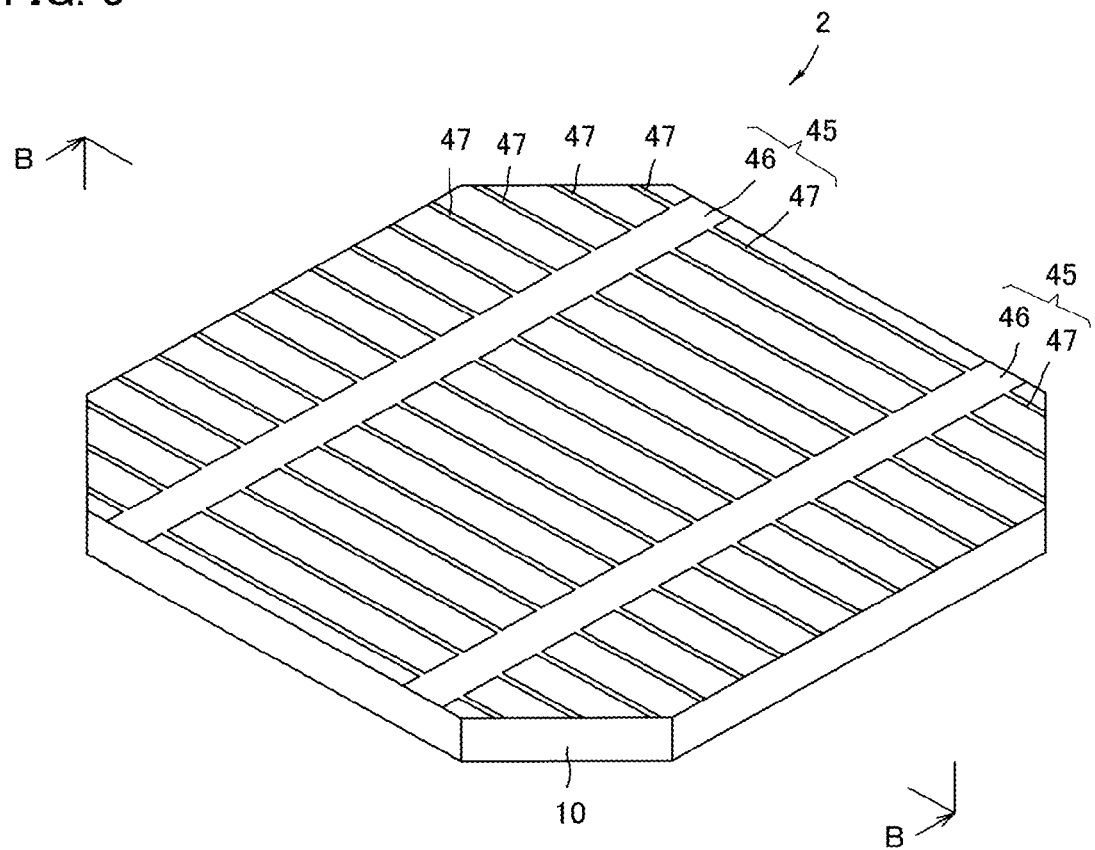
FIG. 3 is a perspective view schematically representing a crystal silicon solar cell of FIG. 2.

As understood from FIG. 3, in each of the crystal silicon solar cells 2, a collector electrode 45 is distributed in a comb-like state in plan view.

The collector electrode 45 is an extraction electrode that extracts electricity generated by a photoelectric conversion part 10 (see FIG. 4), and is formed of a plurality of bus bar parts 46, and a large number of finger parts 47. The bus bar parts 46 extend in a predetermined direction in a plane direction of the crystal silicon solar cell 2. The finger parts 47 extend in a direction that is the plane direction of the crystal silicon solar cell 2, and intersects with the extending direction of the bus bar parts 46.

In the solar cell module 1 of this embodiment, a part of the collector electrode 45 of each crystal silicon solar cell 2 is formed by a plating method. The present invention has one of characteristics in a method for forming the collector electrode 45.

Additionally, one of the characteristics of a method for manufacturing the solar cell module 1 of this embodiment is to irradiate a laser beam intentionally beyond a second electrode 17 that forms a part of the collector electrode 45, in a laser step described later.

Based on these characteristic, each crystal silicon solar cell 2 of the first embodiment will be hereinafter described in detail.

First, a main characteristic portion of the crystal silicon solar cell 2 will be described.

The crystal silicon solar cell 2 is a heterojunction crystal silicon solar cell (hereinafter also referred to as "heterojunction solar cell").

Figure 4:
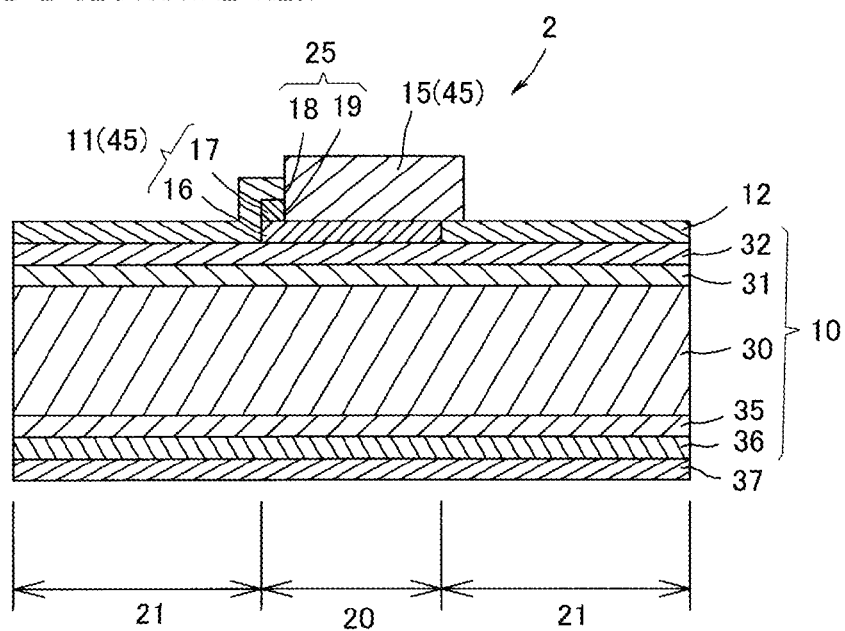
FIG. 4 is a B-B sectional view representing an essential part of a crystal silicon solar cell of FIG. 3, and illustrates a texture structure in plan view in order to facilitate understanding.

As shown in FIG. 4, in the crystal silicon solar cell 2, the collector electrode 45 and an insulating layer 12 are formed on one main surface (first main surface) of the photoelectric conversion part 10.

Additionally, in the crystal silicon solar cell 2, a rear surface metal electrode 37 is formed on the other main surface (second main surface) of the photoelectric conversion part 10.

As shown in FIG. 4, the collector electrode 45 includes an electrode layer 11, and a metal layer 15.

The electrode layer 11 is formed of a first electrode 16, and the second electrode 17 (removal-target body).

Specifically, as shown in FIG. 4, the electrode layer 11 is formed on a light incident side transparent electrode layer 32 located on an uppermost surface of the first main surface side of the photoelectric conversion part 10. The electrode layer 11 has a laminated structure in which the first electrode 16, and the second electrode 17 are laminated in order from the side of the transparent electrode layer 32.

The electrode layer 11 has a hole 19 extending in a thickness direction (laminated direction) from the outside of the second electrode 17 toward the first electrode 16.

The hole 19 is a bottomed hole, the bottom of which is the first electrode 16. The hole 19 passes through the second electrode 17 in the thickness direction.

As shown in FIG. 4, the insulating layer 12 covers the outside of the photoelectric conversion part 10 and the electrode layer 11, and has an opening 18 continuous with the hole 19. The opening 18 is a through hole that passes through the insulating layer 12 in the thickness direction. The opening 18 and the hole 19 are communicated with each other, and form a communication hole 25. That is, the communication hole 25 is a bottomed hole that employs the first electrode 16 as a bottom, and extends toward the outside in the thickness direction.

As shown in FIG. 4, the metal layer 15 is filled in the communication hole 25, and further covers a part of the outside of the insulating layer 12.

The metal layer 15 is in contact with the first electrode 16 at the bottom of the communication hole 25, and is further in contact with the second electrode 17 and the insulating layer 12 that form an inner wall surface of the communication hole 25.

As shown in FIG. 4, the rear surface metal electrode 37 located on the second main surface side of the photoelectric conversion part 10 is formed on a rear surface side transparent electrode layer 36 located on the rearmost surface of the photoelectric conversion part 10.

When the first main surface of the photoelectric conversion part 10 is planarly viewed, the electrode layer 11 of the crystal silicon solar cell 2 is formed in a predetermined pattern (e.g., comb-shape), and an electrode layer formation area 20 in which the electrode layer 11 is formed, and an electrode layer non-formation area 21 other than the area are present.

In this embodiment, the electrode layer 11 is formed of the first electrode 16 and the second electrode 17, and therefore the "electrode layer formation area" means an area where at least one of the first electrode 16 and the second electrode 17 is formed.

Regarding the electrode layer formation area 20, the crystal silicon solar cell 2 has a sectional structure in which the electrode layer 11, the insulating layer 12, and the metal layer 15 are laminated on the photoelectric conversion part 10 in this order, as shown in FIG. 4. Additionally, the crystal silicon solar cell 2 also has a sectional structure in which the electrode layer 11 and the metal layer 15 are laminated on the photoelectric conversion part 10 in this order.

As shown in FIG. 4, the communication hole 25 is located near one of the sides of the electrode layer formation area 20 in a width direction (direction orthogonal to the extending direction of the collector electrode 45). That is, the communication hole 25 is formed along the end of the electrode layer formation area 20, and the metal layer 15 is formed along this communication hole 25.

Regarding the electrode layer non-formation area 21, in the crystal silicon solar cell 2, the photoelectric conversion part 10 is directly covered with the insulating layer 12, as shown in FIG. 4.

Now, the materials and the like of the respective main portions of the crystal silicon solar cell 2 will be described.

(Electrode Layer 11)

As described above, the electrode layer 11 is formed of the first electrode 16, and the second electrode 17.

The first electrode 16 is a conductor having higher conductivity than the light incident side transparent electrode layer 32, and having low contact resistance with the light incident side transparent electrode layer 32, to some extent.

The first electrode 16 is formed of a material that is unlikely to be removed compared to the second electrode 17 when the second electrode 17 is removed by the irradiation by the laser beam. That is, the first electrode 16 has a higher resistance to a laser beam having predetermined output compared to the second electrode 17.

The second electrode 17 is a removal-target body to be removed at least partially by the laser beam used in a laser step described later. The second electrode 17 is also an exfoliation body for removing the insulating layer 12 having transparency.

A method for selecting the first electrode 16 and the second electrode 17 will be described later. Examples of the first electrode 16 that can be employed in the case of a laser beam having generally used output include silver (Ag), copper (Cu), aluminum (Al), and the like. That is, basically, the first electrode 16 is preferably a metal having low light absorption, and high reflectance.

On the other hand, the second electrode 17 is preferably a metal that is relatively easily removed by a laser beam. Examples of the second electrode 17 include tin (Sn), titanium (Ti), chromium (Cr), copper (Cu), and the like.

The materials of the first electrode 16 and the second electrode 17 may be varied depending on types or conditions of laser beams as described later, and are not limited to the above.

The electrode layer 11 can be formed by, for example, by covering a mask on an area where the electrode layer 11 is not to be formed (electrode layer non-formation area 21), and patterning the first electrode 16 and the second electrode 17.

The electrode layer 11 of this embodiment is formed by a sputtering method, a vapor deposition method, or the like, by using a mask.

From a viewpoint of a thickness that is enough to reflect a laser beam, and productivity, the thickness (film thickness) of the first electrode 16 in this case is preferably not less than 50 nm and not more than 1 μm, is more preferably not less than 100 nm and not more than 700 nm, and is particularly preferably not less than 300 nm and not more than 600 nm. From a viewpoint of ensuring a thickness that is enough to reflect a laser beam, the thickness (film thickness) of the first electrode 16 in this case is preferably not less than 50 nm, is more preferably not less than 100 nm, and is particularly preferably not less than 300 nm.

From a viewpoint of productivity, the thickness of the first electrode 16 is preferably not more than 1 μm, is more preferably not more than 700 nm, and is particularly preferably not more than 600 nm.

On the other hand, all of the second electrode 17 does not necessarily have to be removed by a laser beam, but the thickness (film thickness) of the second electrode 17 should be such a thickness that the insulating layer on the second electrode can be removed. That is, from a viewpoint of ensuring such a thickness that the insulating layer on the second electrode can be removed, the thickness (film thickness) of the second electrode 17 is preferably not less than 50 nm, is more preferably not less than 100 nm, and is particularly preferably not less than 200 nm.

From a viewpoint of reduction in a cost, the thickness of the second electrode 17 is preferably not more than 700 nm, is more preferably not more than 600 nm, and is particularly preferably not more than 500 nm.

(Insulating Layer 12)

The insulating layer 12 is a layer that has an electric insulating property, and limits an area where the metal layer 15 is formed in a plating step.

The material of the insulating layer 12 is desirably a material having chemical stability to a plating solution used in the plating step. A material having high chemical stability to the plating solution is used as the material of the insulating layer 12, so that, in the plating step, the insulating layer 12 is unlikely to be dissolved in the plating solution, and damage to the surface of the photoelectric conversion part 10 is unlikely to occur.

As shown in FIG. 4, the insulating layer 12 is formed on at least the second electrode 17 of the electrode layer formation area 20, including the opening 18. In particular, the insulating layer 12 is preferably formed on the whole surface of the electrode layer 11 of the electrode layer formation area 20, including the opening 18.

Furthermore, the insulating layer 12 is preferably formed also on the electrode layer non-formation area 21 where the electrode layer 11 is not formed. That is, the insulating layer 12 is preferably formed including the electrode layer formation area 20 and the electrode layer non-formation area 21.

In a case where the insulating layer 12 is formed not only on the electrode layer formation area 20 but also on the electrode layer non-formation area 21, the insulating layer 12 can chemically and electrically protect the photoelectric conversion part 10 from the plating solution when the metal layer 15 is formed by the plating method.

For example, in a case where the transparent electrode layer 32 is formed on the uppermost surface of the photoelectric conversion part 10 like the solar cell 2 that is a heterojunction solar cell, the insulating layer 12 is formed on the surface of the transparent electrode layer 32, so that contact between the transparent electrode layer 32 and the plating solution is suppressed, and the metal layer 15 can be prevented from being deposited on the transparent electrode layer 32.

The insulating layer 12 is preferably formed also on the surface of the photoelectric conversion part 10.

From a viewpoint of productivity, the insulating layer 12 is more preferably formed on the whole areas of the electrode layer formation area 20 and the electrode layer non-formation area 21 including the opening 18.

In the crystal silicon solar cell 2, depending on the type (e.g., copper) of a plating layer deposited from the plating solution, there is a risk of diffusing the plating layer in silicon configuring a part of or all of the photoelectric conversion part 10, for example. Also from this point, the insulating layer 12 is preferably formed on the whole areas of the electrode layer formation area 20 and the electrode layer non-formation area 21 including the opening 18.

The insulating layer 12 of this embodiment is formed on the whole areas of the electrode layer formation area 20 and the electrode layer non-formation area 21 including the opening 18.

In a case where the insulating layer 12 is formed not only on the electrode layer formation area 20 but also on the electrode layer non-formation area 21 like this embodiment, the insulating layer 12 preferably has high adhesive strength to the surface of the photoelectric conversion part 10.

For example, in the heterojunction solar cell, the insulating layer 12 preferably has high adhesive strength to the transparent electrode layer 32 located on the uppermost surface of the photoelectric conversion part 10.

The adhesive strength between the transparent electrode layer 32 and the insulating layer 12 is made higher, so that the insulating layer 12 is unlikely to be peeled during the plating step, and metal can be prevented from being deposited on the transparent electrode layer 32.

Since the crystal silicon solar cell 2 of this embodiment is the heterojunction solar cell, a material having high adhesive strength between the transparent electrode layer 32 located on the surface of the photoelectric conversion part 10 and the insulating layer 12 is employed as the material of the insulating layer 12 from the above viewpoint.

As the material of the insulating layer 12, a material having little light absorption is preferable. That is, the insulating layer 12 preferably has transparency.

The insulating layer 12 is formed on the light incident surface side (first main surface side) of the photoelectric conversion part 10, and therefore in a case where the light absorption of the insulating layer 12 is little, more light can be captured in the photoelectric conversion part 10. For example, in a case where the insulating layer 12 has sufficient transparency in which transmittance is 90% (percent) or more, an optical loss due to light absorption in the insulating layer 12 is small, and therefore the formation obtained after forming the metal layer 15 can be used as a solar cell without removing the insulating layer 12 after forming the metal layer 15.

In a case where the insulating layer 12 is used as a part of the solar cell 2 without removing the insulating layer 12 in a step subsequent to the plating step, like a manufacturing method of this embodiment described later, a material having sufficient weather resistance, and stability to heat and humidity in addition to transparency is desirably used as the material of the insulating layer 12.

As the insulating layer 12 of this embodiment, the material having transparency in which transmittance is 90 percent or more is employed, and furthermore, the material having sufficient weather resistance, and stability to heat and humidity is employed. Therefore, it is possible to simplify the manufacturing step of the crystal silicon solar cell 2, and to improve productivity.

As the material of the insulating layer 12, either of an inorganic insulating material and an organic insulating material may be employed.

As the inorganic insulating material, for example, silicon oxide, silicon nitride, titanium oxide, aluminum oxide, magnesium oxide, zinc oxide, or the like can be used.

As the organic insulating material, for example, polyester, ethylene-vinyl acetate copolymer, an acrylic resin, an epoxy resin, polyurethane, or the like can be used.

Among these inorganic materials, silicon oxide, silicon nitride, silicon nitride oxide, aluminum oxide, sialon (SiAlON), yttrium oxide, magnesium oxide, barium titanate, samarium oxide, barium tantalate, tantalum oxide, magnesium fluoride, titanium oxide, strontium titanate, or the like is preferably used from a viewpoint of resistance to a plating solution or transparency.

Among these materials, silicon oxide, silicon nitride, silicon nitride oxide, aluminum oxide, sialon, yttrium oxide, magnesium oxide, barium titanate, samarium oxide, barium tantalate, tantalum oxide, magnesium fluoride, or the like is preferable as the material of the insulating layer 12 from a viewpoint of electric characteristics, adhesion with the transparent electrode layer 32, or the like. From a viewpoint of suitable adjustability of refractive index, silicon oxide, silicon nitride, or the like is more preferably used.

These inorganic materials are not limited to materials having a stoichiometric composition, and may exhibit oxygen deficiency or the like.

The film thickness of the insulating layer 12 is preferably thin enough to form the opening 18 in the insulating layer 12 when the second electrode 17 is removed by the irradiation by the laser beam.

From this viewpoint, the film thickness of the insulating layer 12 is preferably 5000 nm or less, is more preferably 1000 nm or less, and is particularly preferably 500 nm or less.

The optical characteristics or the film thickness of the insulating layer 12 in the electrode layer non-formation area 21 are suitably set, thereby improving light reflection characteristics, and enabling increase in the quantity of light introduced in the inner side (photoelectric conversion part 10) of the solar cell 2.

That is, the optical characteristics or the film thickness of the insulating layer 12 is suitably set, so that the conversion efficiency of the solar cell 2 can be more improved.

In order to obtain such effects, the refractive index of the insulating layer 12 is preferably lower than the refractive index of the surface of the photoelectric conversion part 10.

In a case where the transparent electrode layer 32 (general refractive index: about 1.9 to 2.1) is provided on the surface of the photoelectric conversion part 10 like the solar cell 2 that is the heterojunction solar cell, the refractive index of the insulating layer 12 is preferably an intermediate value between that of air (refractive index=1.0) and of the transparent electrode layer 32.

Furthermore, in a case where the crystal silicon solar cells 2 (solar cells) are sealed to be modularized like the solar cell module 1 of this embodiment, the refractive index of the insulating layer 12 is preferably an intermediate value between that of the sealing material 7 and of the transparent electrode layer 32.

From the above viewpoints, the refractive index of the insulating layer 12 is preferably, for example 1.4 to 1.9, is more preferably 1.5 to 1.8, and is further more preferably 1.55 to 1.75. By taking such a range, a light antireflection effect on the interface is enhanced, and the quantity of light introduced in the inner side (photoelectric conversion part 10) of each solar cell 2 can be improved.

The refractive index in this specification is a refractive index to light having a wavelength of 550 nm, and a value measured by spectroscopic ellipsometry, unless otherwise stated. The optical film thickness (refractive index×film thickness) of the insulating layer 12 is preferably set according to the refractive index of the insulating layer 12 so as to improve antireflection characteristics.

From a viewpoint of imparting suitable antireflection characteristics to the insulating layer 12, the film thickness of insulating layer 12 is preferably set in a range from 30 nm to 250 nm, and is more preferably set in a range from 50 nm to 250 nm.

The film thickness of the insulating layer 12 in the electrode layer formation area 20 and the film thickness of the insulating layer 12 in the electrode layer non-formation area 21 may be different.

For example, the film thickness of the insulating layer 12 in the electrode layer formation area 20 may be set in a viewpoint of facilitating the formation of the opening 18 by the irradiation by the laser beam. The film thickness of the insulating layer 12 in the electrode layer non-formation area 21 may be set to be an optical film thickness having suitable antireflection characteristics.

That is, the film thickness of the insulating layer 12 in the electrode layer non-formation area 21 may be made larger than the film thickness of the insulating layer 12 in the electrode layer formation area 20.

A method for forming the insulating layer 12 is not particularly limited. For example, in the case of the inorganic insulating material such as silicon oxide and silicon nitride, a dry method such as a plasma CVD method and a sputtering method is preferably used. Additionally, in the case of the organic insulating material, a wet method such as a spin coat method and a screen printing method is preferably used. According to these methods, it is possible to form a film having fewer defects such as a pinhole, and having a dense structure.

Among these, the insulating layer 12 is preferably formed by the plasma CVD method from a viewpoint of the formation of the film having a more dense structure. This method enables the formation of a film having high density structure, not only in a case where the thickness of the insulating layer 12 is thick, for example, about 200 nm, but also in a case where the thickness of the insulating layer 12 is thin, for example, about 30 nm to 100 nm.

For example, in a case where the photoelectric conversion part 10 has the texture structure (unevenness configuration) on the surface of photoelectric conversion part, like the crystal silicon solar cell 2, the insulating layer 12 is preferably formed by the plasma CVD method from a viewpoint of accurately forming a film also on recesses and protrusions of the texture structure.

A material having high density is used as the insulating layer 12, so that deposition of metal on the transparent electrode layer 32 can be prevented in addition to reduction of damage to the transparent electrode layer 32 during a plating process.

Furthermore, such a insulating layer 12 having high density can function as a barrier layer for water, oxygen, or the like also to an inner layer of the photoelectric conversion part 10, like the silicon-based thin films 31 and 35 of the crystal silicon solar cell 2. Therefore, the material having high density is used for the insulating layer 12, so that it is possible to expect an effect of improving long term reliability of the crystal silicon solar cell 2.

(Metal Layer)

The metal layer 15 is a plating layer that configures a part of the collector electrode 45, and is formed by a plating method.

The material of the metal layer 15 is not limited as long as a material enabling formation by a plating method is used. For example, copper, nickel, tin, aluminum, chromium, silver, gold, zinc, lead, palladium, or the like, the mixture of these, or an alloy can be used.

Ninety-five percent or more of the whole of the metal layer 15 is preferably formed of a metal simple substance or metal alloy.

In this embodiment, the metal layer 15 is formed of a copper elemental substance. Therefore, the metal layer 15 of this embodiment has sufficiently low resistance as the collector electrode 45, and is formed at a lower cost compared to a case where precious metal such as silver and gold is used.

During the operation (power generation) of the solar cell 2, a current generated in the photoelectric conversion part 10 mainly flows through the metal layer 15. Therefore, from a viewpoint of suppressing a resistance loss in the metal layer 15, the line resistance of the metal layer 15 is preferably as low as possible. Specifically, the line resistance of the metal layer 15 is preferably 1 Ω/cm or less, and is more preferably 0.5 Ω/cm or less.

On the other hand, the line resistance of the first electrode 16 and the line resistance of the second electrode 17 each should be small enough to function as an underlayer at the time of electroplating, for example, 5 Ω/cm or less.

In a case where the first electrode 16 and the second electrode 17 each are formed in a comb-shape, and power is directly supplied to the photoelectric conversion part 10 through the first electrode 16 and the second electrode 17 like in this embodiment, the line resistance of the first electrode 16 and the line resistance of the second electrode 17 each are preferably 5 Ω/cm or less.

The metal layer 15 can be formed by any plating method of an electroless plating method and/or an electrolytic plating method, but is suitably formed by the electrolytic plating method, from a viewpoint of productivity.

In the electrolytic plating method, it is possible to increase a deposition rate of metal by controlling a current or the like. Therefore, the metal layer 15 can be formed in a short time.

The metal layer 15 may have a multilayer structure including a plurality of layers. For example, a first plating layer made of a material having high conductivity such as copper is formed on the first electrode 16 and the second electrode 17 through the opening 18 of the insulating layer 12, and thereafter, a second plating layer having excellent chemical stability is formed on the surface of the first plating layer, so that the collector electrode 45 having excellent chemical stability and low resistance can be formed.

(Rear Surface Metal Electrode 37)

The rear surface metal electrode 37 has high reflectance in a range from a near infrared region to an infrared region, and a material having high conductivity or high chemical stability is desirably used.

Examples of a material satisfying such characteristics include silver, aluminum, copper, gold, and the like.

A method for forming a film of the rear surface metal electrode 37 is not particularly limited, but a physical vapor deposition method such as a sputtering method and a vacuum vapor deposition method, a printing method such as a screen printing, or the like is applicable. The rear surface metal electrode 37 may be formed by a plating method, similarly to the metal layer 15. In this case, from a viewpoint of reducing the number of producing steps of the solar cell 2, the rear surface metal electrode 37 and the metal layer 15 are preferably formed at the same time.

Now, a detailed configuration of each crystal silicon solar cell 2 will be described. Description of parts overlapped with the above description will be omitted.

Figure 5:
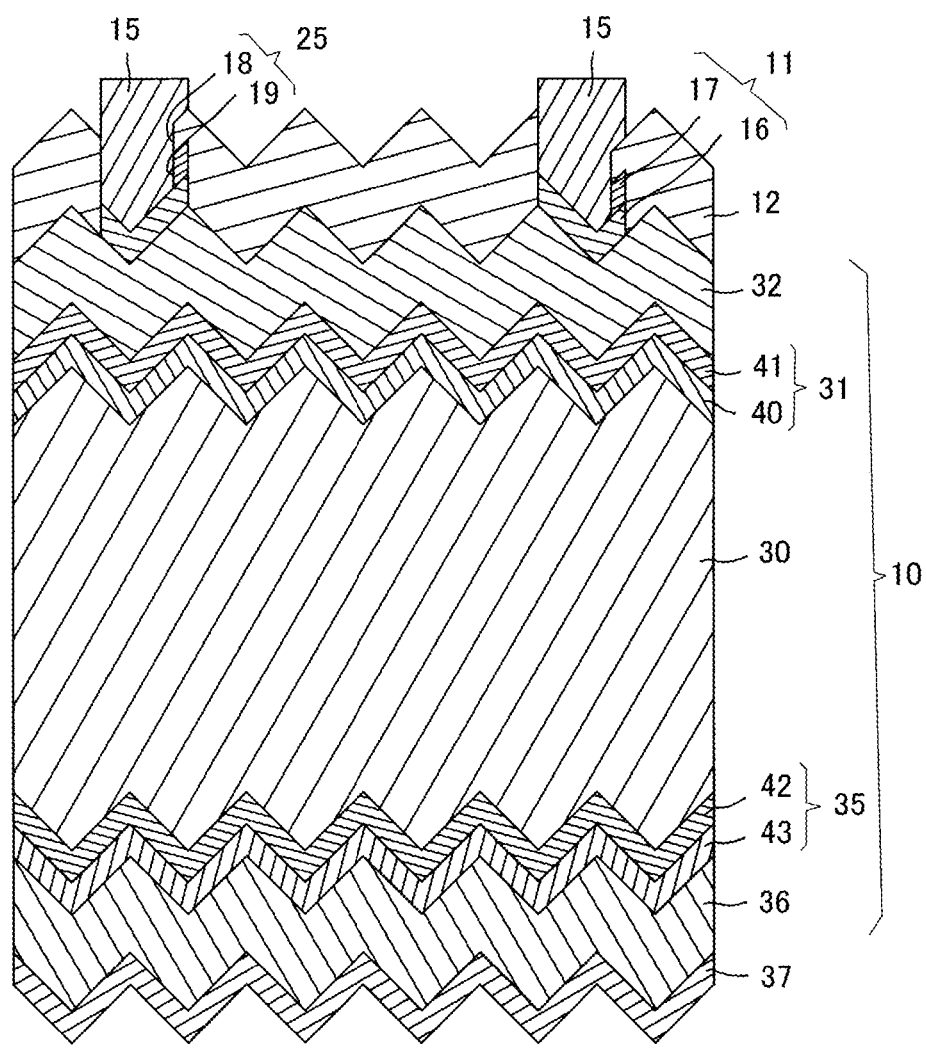
FIG. 5 is a B-B sectional view representing the crystal silicon solar cell of FIG. 3.

As shown in FIG. 5, the photoelectric conversion part 10 forming a skeleton of the crystal silicon solar cell 2 is configured by laminating a silicon-based thin film 31 and the light incident side transparent electrode layer 32 on one main surface (surface on the first main surface side) of one conductivity-type single crystal silicon substrate 30.

Additionally, the photoelectric conversion part 10 is configured by laminating a silicon-based thin film 35 and the rear surface side transparent electrode layer 36 on the other main surface (surface on the second main surface side) of the one conductivity-type single crystal silicon substrate 30. That is, the outermost surfaces of the photoelectric conversion part 10 are formed of the transparent electrode layers 32 and 36.

The silicon-based thin film 31 is formed by laminating an intrinsic silicon-based thin film 40 and a opposite conductivity-type silicon-based thin film 41 in order from the side of the one conductivity-type single crystal silicon substrate 30.

The silicon-based thin film 35 is formed by laminating an intrinsic silicon-based thin film 42 and one conductive type silicon-based thin film 43 in order from the side of the one conductivity-type single crystal silicon substrate 30.

In the crystal silicon solar cell 2, the silicon-based thin film 31 and the transparent electrode layer 32 are formed on the substantially whole surface of the one main surface of the one conductivity-type single crystal silicon substrate 30.

In the crystal silicon solar cell 2, the electrode layer 11 having the first electrode 16 and the second electrode 17 in this order is formed on a part of the transparent electrode layer 32.

The "substantially whole surface" mentioned herein means that 95 percent or more of a reference surface is covered. Also in the following description, the "substantially whole surface" is similarly defined in principle.

Hereinafter, a material and the like of each portion of the photoelectric conversion part 10 of each crystal silicon solar cell 2 will be described. For an internal structure of the photoelectric conversion part 10, inner and outer directions are defined with the silicon substrate as a reference.

First, the one conductivity-type single crystal silicon substrate 30 will be described. Generally, the single crystal silicon substrate contains impurities for supplying charges to silicon in order to impart conductivity. In the single crystal silicon substrate, there are an n-type single crystal silicon substrate containing atoms (e.g., phosphorus) for introducing electrons in silicon atoms, and a p-type single crystal silicon substrate containing atoms (e.g., boron) for introducing electron holes in silicon atoms.

That is, the "One conductive type" in this specification means either an n-type or a p-type.

The crystal silicon solar cell 2 of this embodiment is the heterojunction solar cell as described above, and the heterojunction on the light incident side is preferably a reverse junction from a viewpoint of effectively separating and collecting electron-electron hole pairs.

Additionally, the one conductivity-type single crystal silicon substrate 30 is preferably the n-type single crystal silicon substrate from a viewpoint of improving mobility.

The one conductivity-type single crystal silicon substrate 30 is preferably has a surface having a texture structure from a viewpoint of light confinement.

As shown in FIG. 5, the one conductivity-type single crystal silicon substrate 30 of this embodiment has both surfaces (a face on the first main surface and a face on the second main surface) each having a texture structure.

The conductive type silicon-based thin films 41 and 43 each are an opposite conductivity-type silicon-based thin film or a one conductive type silicon-based thin film.

The "Opposite conductive type" in the present invention means either an n-type or a p-type, and is a conductive type different from the one conductive type.

For example, in a case where an n-type single crystal silicon substrate is used as the one conductivity-type single crystal silicon substrate 30, the one conductive type silicon-based thin film 43 is an n-type silicon-based thin film, and the opposite conductivity-type silicon-based thin film 41 is a p-type silicon-based thin film.

Examples of the silicon-based thin film include an amorphous silicon thin film, a microcrystal silicon (thin film containing amorphous silicon and crystal silicon), and the like. Among these, an amorphous silicon-based thin film is preferably used.

For example, as a suitable configuration of the photoelectric conversion part in a case where the n-type single crystal silicon substrate is used as the one conductivity-type single crystal silicon substrate 30, a laminated configuration of the transparent electrode layer 32, a p-type amorphous silicon-based thin film 41, an i-type amorphous silicon-based thin film 40, an n-type single crystal silicon substrate 30, an i-type amorphous silicon-based thin film 42, an n-type amorphous silicon-based thin film 43, the transparent electrode layer 36 in this order is employed. In this case, from a viewpoint of effectively separating and collecting electron-electron hole pairs, the p-layer side (p-type amorphous silicon-based thin film 41 side) is preferably a light incident surface (first main surface side).

As the intrinsic silicon-based thin films 40 and 42 in contact with the one conductivity-type single crystal silicon substrate 30, i-type hydrogenated amorphous silicon containing silicon and hydrogen is preferable.

When a film of i-type hydrogenated amorphous silicon is formed on the one conductivity-type single crystal silicon substrate 30 by a CVD method, surface passivation can be effectively performed while suppressing diffusion of impurities to the one conductivity-type single crystal silicon substrate 30. Additionally, an effective profile for carrier collection can be provided to an energy gap by changing a hydrogen amount in the film.

In this embodiment, the p-type silicon-based thin film forming the opposite conductivity-type silicon-based thin film 41 is preferably a p-type hydrogenated amorphous silicon layer, a p-type amorphous silicon carbide layer, or a p-type amorphous silicon oxide layer.

From a viewpoint of suppressing diffusion of impurities or lowering series resistance, the p-type hydrogenated amorphous silicon layer is preferable.

On the other hand, the p-type amorphous silicon carbide layer and the p-type amorphous silicon oxide layer each are a low refractive index layer having a wide gap. Therefore, these layers are preferable from a point of enabling reduction in an optical loss.

The crystal silicon solar cell 2 is the heterojunction solar cell as described above, and therefore the photoelectric conversion part 10 is preferably provided with the transparent electrode layers 32 and 36 on the outsides of the conductive type silicon-based thin films 41 and 43.

The transparent electrode layers 32 and 36 each contain a conductive oxide as a main component.

As this conductive oxide, for example, a transparent conductive oxide such as zinc oxide, indium oxide, and tin oxide can be independently used, or can be mixed.

As this conductive oxide, from a viewpoint of conductivity, optical characteristics, and long term reliability, an indium-based oxide containing indium oxide is preferable. Among this, a conductive oxide containing indium tin oxide (ITO) as a main component is preferably used.

The "main component" herein means that the content is 50 percent by weight or more, is preferably 70 percent by weight or more, and is more preferably 90 percent by weight or more. The transparent electrode layers 32 and 36 each may be a single layer, or may have a laminated structure including a plurality of layers.

Doping agents can be added to the transparent electrode layers 32 and 36.

For example, in a case where zinc oxide is used as the transparent electrode layers 32 and 36, examples of a preferable doping agent include aluminum, gallium, boron, silicon, carbon, and the like.

In a case where indium oxide is used as the transparent electrode layers 32 and 36, examples of a preferable doping agent include zinc, tin, titanium, tungsten, molybdenum, silicon, and the like.

In a case where tin oxide is used as the transparent electrode layers 32 and 36, examples of a preferable doping agent include fluorine, and the like.

The doping agent can be added to one of or both of the transparent electrode layers 32 and 36.

Particularly, the doping agent is preferably added to the light incident side transparent electrode layer 32 on the first main surface side. The doping agent is added to the light incident side transparent electrode layer 32, so that the transparent electrode layer 32 itself has low resistance, and a resistance loss between the transparent electrode layer 32 and the first electrode 16 of the electrode layer 11 can be suppressed.

From a viewpoint of transparency, conductivity, and reduction in light reflection, the film thickness of the light incident side transparent electrode layer 32 is preferably not less than 10 nm and not more than 140 nm.

A role of this transparent electrode layer 32 is to convey carriers to the first electrode 16, and the transparent electrode layer 32 should have conductivity required for this conveyance. The film thickness of the transparent electrode layer 32 is preferably 10 nm or more as described above.

Additionally, the film thickness of the transparent electrode layer 32 is made to be 140 nm or less, so that it is possible to reduce an absorption loss in the transparent electrode layer 32, and to suppress reduction in photoelectric conversion efficiency due to reduction in transmittance. Furthermore, when the film thickness of the transparent electrode layer 32 is within the above range, it is possible to prevent the rising of carrier concentration in the transparent electrode layer 32 and to suppress reduction in photoelectric conversion efficiency due to reduction in transmittance in an infrared region.

Now, a method of manufacturing each solar cell 2 in the first embodiment will be described.

First, a photoelectric conversion part formation step of forming the photoelectric conversion part 10 is performed.

In the photoelectric conversion part formation step, the silicon-based thin films 31 and 35 are first formed on the front and rear surfaces of the one conductivity-type single crystal silicon substrate 30 formed with texture structures (silicon-based thin film formation step).

That is, the intrinsic silicon-based thin film 40 and the opposite conductivity-type silicon-based thin film 41 are formed on the surface on the first main surface side of the one conductivity-type single crystal silicon substrate 30. Additionally, the intrinsic silicon-based thin film 42 and the one conductive type silicon-based thin film 43 are formed on the surface on the second main surface side of the one conductivity-type single crystal silicon substrate 30.

At this time, a plasma CVD method is preferable as methods of forming silicon-based thin films 31 and 35. As a formation condition for each of the silicon-based thin films 31 and 35 by the plasma CVD method, a substrate temperature of 100° C. to 300° C., a pressure of 20 Pa to 2600 Pa, a high-frequency power density of 0.004 W/cm$^2$ to 0.8 W/cm$^2$ are preferably used.

As a material gas used for the formation of the silicon-based thin films 31 and 35, a silicon-containing gas such as silane ($SiH_4$) and disilane ($Si_2H_6$), or a mixed gas of silicon-based gas and hydrogen ($H_2$) is preferably used.

After the silicon-based thin film formation step, the transparent electrode layers 32 and 36 are laminated from the outsides of the silicon-based thin films 31 and 35 (transparent electrode layer formation step).

At this time, a method for forming each of the transparent electrode layers 32 and 36 is not particularly limited, but a physical vapor deposition method such as a sputtering method, a chemical vapor deposition (MOCVD) method utilizing reaction between an organometallic compound and oxygen or water, or the like is preferable. In any film formation method, heat or plasma discharge energy can be also utilized.

A substrate temperature for producing each of the transparent electrode layers 32 and 36 is suitably set. For example, in a case where an amorphous silicon-based thin film is used as each of the silicon-based thin films 31 and 35, 200° C. or less is preferable.

The substrate temperature is set to 200° C. or less, so that it is possible to suppress desorption of hydrogen from the amorphous silicon layer, or generation of dangling bond of silicon atoms resulting from the desorption, thereby resulting in improvement of conversion efficiency.

The film formation range of each of the transparent electrode layers 32 and 36 is not particularly limited. The transparent electrode layers 32 and 36 each may be formed on the whole surface, or may be formed so as to avoid a peripheral end from a viewpoint of short-circuit prevention.

The above is the photoelectric conversion part formation step.

After the transparent electrode layer formation step of the photoelectric conversion part formation step, the electrode layer 11 is formed on the light incident side transparent electrode layer 32 of the photoelectric conversion part 10, as shown in FIG. 6(a) (electrode layer formation step).

Specifically, the first electrode 16 is directly formed on the light incident side transparent electrode layer 32, and the second electrode 17 is further formed on the first electrode 16.

As a method for forming the first electrode 16 and the second electrode 17, the first electrode 16 and the second electrode 17 may be each formed in a pattern shape by a vapor deposition method, a sputtering method, or the like by using a mask. Additionally, as the method for forming the first electrode 16 and the second electrode 17, a paste containing the first electrode 16 and/or the second electrode 17 as a granular material can be patterned by a printing method.

In this case, for example, the second electrode 17 may be formed on the first electrode 16 after the first electrode 16 is formed, or the first electrode 16 and the second electrode 17 may be formed at the same time.

In this embodiment, the second electrode 17 is formed on the first electrode 16 after the first electrode 16 is formed. A case where the first electrode 16 and the second electrode 17 are formed at the same time will be described in detail in a fourth embodiment described later.

In this embodiment, on the first electrode 16 patterned in a desired shape, the second electrode 17 patterned in substantially the same shape as the first electrode 16 is laminated, thereby forming the electrode layer 11.

"Patterned in substantially the same shape" means to pattern such that 95 percent or more of the total is overlapped when one planarly overlaps with the other.

After the electrode layer formation step, the insulating layer 12 is further formed on the photoelectric conversion part 10 on which the electrode layer 11 is formed (hereinafter the photoelectric conversion part 10 and a laminated body on the photoelectric conversion part 10 are collectively referred to as a laminated substrate) (insulating layer formation step).

That is, as shown in FIG. 6(b), the insulating layer 12 is formed so as to cover the photoelectric conversion part 10 and the electrode layer 11.

At this time, the insulating layer 12 covers at least the electrode layer 11, and further covers the substantially whole surface on the first main surface side of the photoelectric conversion part 10.

After this insulating layer formation step, a laser step (opening formation step) that is a characteristic of the present invention is performed to the laminated substrate on which the insulating layer 12 is formed.

Specifically, as shown in FIG. 6(c), a laser beam is made to irradiate from the light incident side to the laminated substrate on which the insulating layer 12 is formed.

At this time, the laser beam is made to irradiate the electrode layer formation area 20 and the electrode layer non-formation area 21 so as to trace the electrode layer 11.

Figure 7:
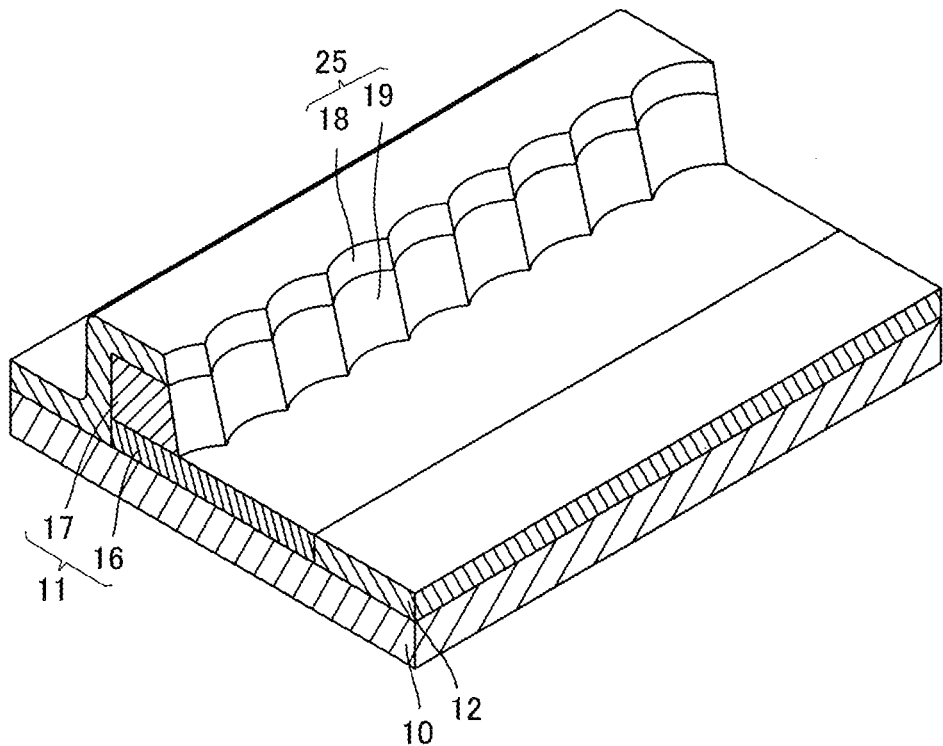
FIG. 7 is a partially broken perspective view representing a condition of the crystal silicon solar cell in the laser step of FIG. 6(c).

At this time, as shown in FIG. 6(c), while the laser beam is mainly made to irradiate along the second electrode 17 of the patterned electrode layer 11, the laser beam is made to irradiate the electrode layer 11 in the electrode layer formation area 20 and the photoelectric conversion part 10 in the electrode layer non-formation area 21. Then, as understood from FIG. 7, on the first electrode 16, the second electrode 17 on a first end (end in a direction orthogonal to a laser beam irradiation direction) side remains, and the second electrode 17 on a second end side is substantially removed.

In this embodiment, as the laser beam, a laser beam having output that does not substantially affect the photoelectric conversion part 10 is selected by a selection method described later.

As shown in FIG. 6(d), by the above laser beam irradiation, a part of or all of the insulating layer 12 and a part of or all of the second electrode 17 are removed from the laminated substrate on which the insulating layer 12 is formed. That is, by the laser beam irradiation, a part of or all of the insulating layer 12 and a part of or all of the second electrode 17 are removed from the outside of insulating layer 12, so that the communication hole 25 (the opening 18 and the hole 19) is formed.

Herein, in the case of using the transparent insulating layer 12, the laser beam for removing the electrode layer 11 does not react to the insulating layer 12 that is generally an insulator, and reacts to the second electrode 17 of the electrode layer 11 that is a conductor. Therefore, by the irradiation by the laser beam, the insulating layer 12 directly laminated on the second electrode 17 is also removed at the same time when the second electrode 17 is removed. In other words, following dissolution or sublimation of the second electrode 17, a corresponding portion of the insulating layer 12 is also peeled. Therefore, in the laser step, the opening 18 can be formed in the insulating layer 12 at a position corresponding to the hole 19 of the second electrode 17.

Thus, in this embodiment, by the irradiation by the laser beam, a part of or all of the second electrode 17 is dissolved or sublimated, and the opening 18 is formed in the insulating layer 12 in the electrode layer formation area 20 that is an area where the patterned electrode layer 11 is formed.

The laminated substrate on which the communication hole 25 is formed in the laser step is immersed in a plating bath, and the metal layer 15 is formed on the electrode layer 11 by a plating method (plating step; metal layer formation step).

At this time, the plating solution passes through the opening 18 of the insulating layer 12, to come into contact with the first electrode 16 and/or the second electrode 17 that form the bottom and the side surface of the communication hole 25. Then, the metal layer 15 is formed mainly with the bottom of the communication hole 25 as the center by the plating method. That is, the metal layer 15 is formed, with the first electrode 16 and/or the second electrode 17 as a seed layer.

Herein, in the plating step, taking acid copper plating as an example, a method for forming the metal layer 15 by an electrolytic plating method will be described.

The laminated substrate obtained after the laser step, and an anode of the plating electrode are immersed in the plating solution in a plating tank. That is, the laminated substrate in which the electrode layer 11 (the first electrode 16 and the second electrode 17), and the insulating layer 12 having the opening 18 are formed on the photoelectric conversion part 10 is immersed in the plating solution.

Then, a voltage is applied between the anode of the plating electrode and the laminated substrate, so that copper that is the metal layer 15 is selectively deposited on the first electrode 16 and the second electrode 17 that are not covered by the insulating layer 12. That is, copper is selectively deposited on the laminated substrate, with the opening 18 generated in the insulating layer 12 by a laser process as a starting point.

At this time, the plating solution used in the acid copper plating, of course, contains copper ions, and the plating solution having a known composition containing copper sulfate, sulfuric acid, and water as a main component, for example, can be used.

After the plating step, a plating solution removal step is preferably performed, and the plating solution remaining on the surface of the laminated substrate is preferably removed. The plating solution removal step is provided, so that it is possible to remove metal that can be deposited with a portion other than the opening 18 of the insulating layer 12 formed in the laser process as a starting point. The metal that is deposited with the portion other than the opening 18 as a starting point is, for example, metal that is deposited with a pinhole of the insulating layer 12 or the like as a starting point.

Such metal is removed by the plating solution removal step, so that it is possible to reduce a shading loss, and to further improve a solar cell characteristic.

The removal of the plating solution can be performed by, for example, a method for removing the plating solution remaining on the surface of the laminated substrate taken out from the plating tank by air blow type air cleaning, and thereafter rinsing, and further blowing a cleaning solution by air blow.

The amount of the plating solution remaining on the surface of the laminated substrate is reduced by air cleaning before rinsing, so that it is possible to reduce the amount of the plating solution carried until the rinsing.

Therefore, it is possible to reduce the amount of the cleaning solution required for rinsing, and to reduce labor for waste liquid disposal accompanying the rinsing. Therefore, it is possible to reduce an environmental load or a cost for cleaning, and to improve the productivity of the solar cell.

By the plating step or a separate step, the rear surface metal electrode 37 is formed on the rear surface side transparent electrode layer 36 of the laminated substrate (rear surface metal formation step).

At this time, the rear surface metal electrode 37 may be patterned in a predetermined shape, or may be formed on the substantially whole surface of the rear surface side transparent electrode layer 36.

After the plating step, or in a separate step, post-treatment for cracks or the like is performed as needed, and the crystal silicon solar cell 2 is manufactured.

Herein, the solar cell 2 is preferably modularized when the solar cell 2 is put to practical use. The modularization of the solar cells 2 is performed by a suitable method.

For example, a plurality of crystal silicon solar cells 2 are connected in series or in parallel by connecting the bus bar parts 46 to the collector electrodes 45 through interconnectors (wiring members 3) such as tabs, and sealed by the sealing material 7, and the protective materials 5 and 6 such as glass plates, thereby attaining modularization.

In this embodiment, a plurality of crystal silicon solar cells 2 manufactured by the above steps are prepared, and the respective crystal silicon solar cells 2 are connected in series or in parallel by the wiring members 3. Then, the protective materials 5 and 6 hold the connected respective crystal silicon solar cells 2 therebetween, and the sealing material 7 is filled between the protective materials 5 and 6 to seal the crystal silicon solar cells 2.

Thus, the modularization is performed, so that the solar cell module 1 is manufactured.

Now, a method for selecting the first electrode 16 and the second electrode 17 will be described.

The present inventor conducted an experiment with respect to resistance of a metal material to a laser beam in the following processes, in order to select a material used in each of the first electrode 16 and the second electrode 17.

That is, a transparent electrode layer of about 100 nm was first formed on a silicon wafer with unevenness. Next, a sample obtained by forming a metal material listed in Table 1 on the transparent electrode layer as an electrode layer was prepared. Thereafter, two types of laser beams, namely an infrared laser (IR) (wavelength: 1064 nm), and second harmonic generation (SHG) (wavelength: 532 nm) of an IR laser are irradiated onto the sample at respective predetermined positions.

It was visually confirmed whether or not the metal material or the transparent electrode layer material was removed. The application of the above laser beams, namely the infrared laser and the second harmonic generation of the IR laser was performed by using a two-wavelength laser beam machine (LAY-746BA-9BK) manufactured by SHIBAURA MECHATRONICS CORPORATION.

Results of the above experiment are shown in Table 1, and Table 2.

In Table 1 and Table 2, a case where the material removal was able to be confirmed is represented by "○", and a case where material removal was not able to be confirmed is represented by "x".

As to the item of "cell damage" in Table 2, the solar cells were separately assembled and a laser beam was irradiated to the solar cell. A laser beam irradiation portion whose lifetime was reduced by 20 percent or more is represented by "x", and a laser beam irradiation portion whose lifetime was not reduced by 20 percent or more is represented by "○". The lifetime was measured by using WT-2000 manufactured by SEMILAB JAPAN K.K.

TABLE 1

| Laser | Power density (μW/μm²) | Ag (5005 Å) | Sn (5030 Å) | Al (5030 Å) | Cr (1512 Å) | Ti (1626 Å) | Cu (5000 Å) |
|---|---|---|---|---|---|---|---|
| IR 30 kHz 25 mm/s | 113 | x | x | x | x | x | x |
| | 225 | x | x | x | x | x | x |
| | 338 | x | x | x | x | x | x |
| | 451 | x | x | x | ○ | ○ | x |
| | 563 | x | ○ | x | ○ | ○ | x |
| | 676 | x | ○ | ○ | ○ | ○ | x |
| | 789 | x | ○ | ○ | ○ | ○ | x |
| | 901 | x | ○ | ○ | ○ | ○ | x |
| | 1014 | ○ | ○ | ○ | ○ | ○ | x |
| | 1127 | ○ | ○ | ○ | ○ | ○ | ○ |
| SHG 30 kHz 25 mm/s | 42 | x | x | x | x | x | x |
| | 85 | x | x | x | x | x | x |
| | 127 | x | x | x | x | x | x |
| | 170 | x | x | x | x | x | x |
| | 212 | x | x | x | x | x | x |

TABLE 1-continued

| Laser | Power density (μW/μm²) | Ag (5005 Å) | Sn (5030 Å) | Al (5030 Å) | Cr (1512 Å) | Ti (1626 Å) | Cu (5000 Å) |
|---|---|---|---|---|---|---|---|
| | 255 | x | ○ | x | x | x | x |
| | 297 | x | ○ | x | x | x | x |
| | 340 | x | ○ | x | x | ○ | x |
| | 382 | x | ○ | x | x | ○ | ○ |
| | 424 | x | ○ | ○ | ○ | ○ | ○ |

TABLE 2

| Laser | Power density (μW/μm²) | ZnO (1.5 um) | ITO (130 nm) | Cell damage |
|---|---|---|---|---|
| IR 30 kHz 25 mm/s | 113 | ○ | ○ | ○ |
| | 225 | ○ | ○ | ○ |
| | 338 | ○ | ○ | ○ |
| | 451 | ○ | ○ | ○ |
| | 563 | ○ | ○ | ○ |
| | 676 | X | X | X |
| | 789 | X | X | X |
| | 901 | X | X | X |
| | 1014 | X | X | X |
| | 1127 | X | X | X |
| SHG 30 kHz 25 mm/s | 42 | ○ | ○ | ○ |
| | 85 | ○ | ○ | ○ |
| | 127 | ○ | ○ | ○ |
| | 170 | ○ | ○ | ○ |
| | 212 | ○ | ○ | ○ |
| | 255 | ○ | ○ | ○ |
| | 297 | ○ | ○ | ○ |
| | 340 | X | ○ | X |
| | 382 | X | X | X |
| | 424 | X | X | X |

First, the selection of the first electrode 16 and the second electrode 17 by using a laser beam having a specific wavelength and power density will be described.

A requirement for the first electrode 16 to be used is that the first electrode 16 has such a resistance as not to be removed by a laser beam, and a requirement for the second electrode 17 to be used is that the second electrode 17 has such a resistance as to be removed by a laser beam.

From this viewpoint, according to Table 1, a metal material affixed with "x" with respect to a laser beam having certain output can be employed as the first electrode 16, and a metal material affixed with "○" can be employed as the second electrode 17. That is, the first electrode 16 and the second electrode 17 are selected by a comparison of "○" and "x" arranged in a column direction of Table 1.

For example, in the case of an IR laser having a wavelength of 1064 nm, and a power density of 563 μW/μm², a material that can be used as the first electrode 16 is silver (Ag), aluminum (Al), or copper (Cu) according to Table 1. On the other hand, a material that can be used as the second electrode 17 is tin (Sn), chromium (Cr), or titanium (Ti).

For example, in the case of a SHG laser having a wavelength of 532 nm, and a power density of 297 μW/μm², a material that can be used as the first electrode 16 is silver (Ag), aluminum (Al), copper (Cu), chromium (Cr), or titanium (Ti), and a material that can be used as the second electrode 17 is tin (Sn), according to Table 1.

Now, the selection of a wavelength and power density of a laser beam that is used will be described.

A requirement for the laser beam to be used is such a laser condition in which the transparent electrode layer 32 is not removed.

From this viewpoint, according to Table 2, power density affixed with "0" in the column of "transparent electrode layer" with respect to a laser beam having a specific wavelength can be employed.

For example, in the case of an IR laser having a wavelength of 1064 nm, an infrared laser (IR laser) having a power density within a range of 113 $\mu W/\mu m^2$ or more and less than 676 $\mu W/\mu m^2$ can be used, according to Table 2.

Preferably, the requirement for the laser beam to be used includes that the laser beam causes less cell damage. That is, it is preferable that a laser beam has output which does not substantially affect the photoelectric conversion part 10.

From this viewpoint, according to Table 2, power density affixed with "○" in the column of "transparent electrode layer" and affixed with "0" in the column of "cell damage" with respect to a laser beam having a specific wavelength is preferable.

In the light of a certain degree of variation of types of laser beams and application conditions depending on apparatuses, based on the above results, in the case of an infrared laser having a wavelength of 1064 nm, power density is preferably 100 $\mu W/\mu m^2$ or more, is more preferably 350 $\mu W/\mu m^2$ or more, is further more preferably 400 $\mu W/\mu m^2$ or more, and is particularly preferably 450 $\mu W/\mu m^2$ or more.

In the case of an infrared laser having a wavelength of 1064 nm, power density is preferably 670 $\mu W/\mu m^2$ or less, is more preferably 650 $\mu W/\mu m^2$ or less, is further more preferably 600 $\mu W/\mu m^2$ or less, and is particularly preferably 570 $\mu W/\mu m^2$ or less.

In the case of a SHG laser having a wavelength of 532 nm, power density is preferably 30 $\mu W/\mu m^2$ or more, is more preferably 40 $\mu W/\mu m^2$ or more, and is further more preferably 250 $\mu W/\mu m^2$ or more.

In the case of a SHG laser having a wavelength of 532 nm, power density is preferably 380 $W/\mu m^2$ or less, is more preferably 340 $\mu W/\mu m^2$ or less, and is further more preferably 300 $\mu W/\mu m^2$ or less.

Whether the laser beam is a basic wave or n-th harmonic generation (n is an integer), the wavelength of the laser beam is preferably 400 nm or more, is more preferably 450 nm or more, and is further more preferably 500 nm or more.

Whether the laser beam is a basic wave or n-th harmonic generation (n is an integer), the wavelength of the laser beam is preferably 1500 nm or less, is more preferably 1300 nm or less, and is further more preferably 1100 nm or less.

Types of laser beams and irradiation conditions vary to a certain degree depending on apparatuses, and are not necessarily limited to the above range.

As long as only the second electrode 17 can be removed without removing the first electrode 16 and damage to the photoelectric conversion part 10 in the electrode layer non-formation area 21 can be minimized, the type of a used laser beam, an irradiation condition, and the like are not particularly limited.

As for the laser beam, for example, the above infrared laser (IR), second harmonic generation (SHG), third harmonic generation (THG), or the like can be used, but it is particularly preferable to use a SHG laser or an IR laser.

According to the method for manufacturing the solar cell module 1 of this embodiment, the metal layer 15 can be easily formed by a plating method, and therefore it is possible to reduce a cost compared to a conventional method.

Additionally, in the method for manufacturing the solar cell module 1 of this embodiment, each opening 18 is formed in the insulating layer 12 by irradiation by a laser beam. Therefore, the opening 18 can be formed without using a resist or the like.

Additionally, according to the method for manufacturing the solar cell module 1 of this embodiment, the overlapped width of the second electrode 17 with the laser beam is controlled, so that the opening width of opening 18 can be easily controlled. Therefore, it is possible to form the metal layer 15 having a desired width, and to easily thin the collector electrode 45.

Furthermore, in the solar cell module 1 of this embodiment, the laser beam that does not substantially influence the photoelectric conversion part 10 is applied, and therefore the solar cell module is attained in which the damage to the photoelectric conversion part 10 by the laser beam is less, and a photoelectric conversion rate is high.

Additionally, in the method for manufacturing the solar cell module 1 of this embodiment, a layer obtained by laminating the second electrode 17 on the first electrode 16 is used as the electrode layer 11. Then, in the electrode layer formation area 20, the surface of the photoelectric conversion part 10 is covered by the first electrode 16, and the second electrode 17 partially remains. Therefore, according to the method for manufacturing the solar cell module 1 of this embodiment, it is possible to further suppress damage to the photoelectric conversion part 10 due to the entrance of the plating solution from the opening 18 in the plating step.

In a technique shown in Patent Document 6, the intensity of a laser beam is not accurately set, and therefore it is necessary to apply the laser beam only onto a surface electrode as shown in FIG. 16(a). Therefore, as shown in FIG. 16(c), in a case where the laser beam is made to irradiate to an area wider than the surface electrode, or in a case where the laser beam is made to irradiate wrongly beyond the surface electrode, there is a possibility that damage due to the laser beam is caused in the photoelectric conversion part at a surface electrode peripheral part, as shown in FIG. 16(d). That is, there is a risk that a part of the photoelectric conversion part is damaged due to the laser beam.

Additionally, in a case where the laser beam is made to irradiate in a condition where the photoelectric conversion part 10 is damaged, the laser beam should be irradiated only onto the second electrode 17. In this case, there is a possibility of causing a problem such as difficulty of alignment of the laser beam, and increase in process time due to the irradiation by the laser beam to a patterned portion.

For example, in a case where the electrode layer 11 is formed only of the first electrode 16, and the insulating layer 12 is formed on the whole surface of the electrode layer 11 so as to cover the electrode layer 11, when the opening 18 is to be formed in the insulating layer 12 located on the first electrode 16, a part of or all of the first electrode 16 needs to be removed by the laser beam. At this time, the laser beam is generally made to irradiate in a condition where the photoelectric conversion part 10 can be damaged. Therefore, it is necessary to accurately irradiate the laser beam to the electrode layer formation area 20.

Furthermore, when the first electrode 16 is excessively removed, an uppermost surface layer (e.g., the transparent electrode layer) of the photoelectric conversion part 10 sometimes comes into contact with the plating solution, like Patent Document 5 or the like. Such a case causes a problem that the transparent electrode layer is damaged by the plating solution, contact resistance between the uppermost surface layer and the plating layer increases, and a curvature factor increases.

On the other hand, according to the method for manufacturing the solar cell module 1 of this embodiment, the selection is made such that the output of the laser beam does not substantially influence the photoelectric conversion part 10. That is, the laser beam is made to irradiate in a condition where the damage to the photoelectric conversion part 10 is less, on the assumption that the laser beam is made to irradiate beyond the electrode layer 11, and therefore even when the spot diameter of the laser beam goes beyond the electrode layer 11, it is possible to prevent the damage to the photoelectric conversion part 10. Therefore, the irradiation position of the laser beam is not necessarily limited to only a position on the second electrode 17. Even when the spot diameter of the laser beam is large, the laser beam can be irradated onto the laminated substrate without regard to a pattern. That is, according to the method for manufacturing the solar cell module 1, even when the irradiation range of the laser beam is not precisely controlled, the opening 18 can be formed in the insulating layer 12, and excellent productivity is attained.

The solar cell that uses the crystal silicon substrate like the heterojunction solar cell has a large generated current amount. Therefore, an energy loss resulting from the contact resistance between the transparent electrode layer and the collector electrode generally tends to become noticeable.

On the other hand, in the solar cell module 1 of this embodiment, the collector electrode 45 having the first electrode 16, the second electrode 17, and the metal layer 15 has low contact resistance with the transparent electrode layer 32, and therefore it is possible to reduce power generation loss resulting from the contact resistance.

Now, a solar cell module of a second embodiment will be described. Parts similar to those of the first embodiment are denoted by the same numerals, and description thereof is omitted. The solar cell module of the second embodiment is different from the solar cell module 1 of the first embodiment, in shapes of solar cells 60.

That is, the solar cells 60 of the second embodiment are different from the solar cells 2 of the first embodiment, in formation positions of communication holes 25.

Figure 8:
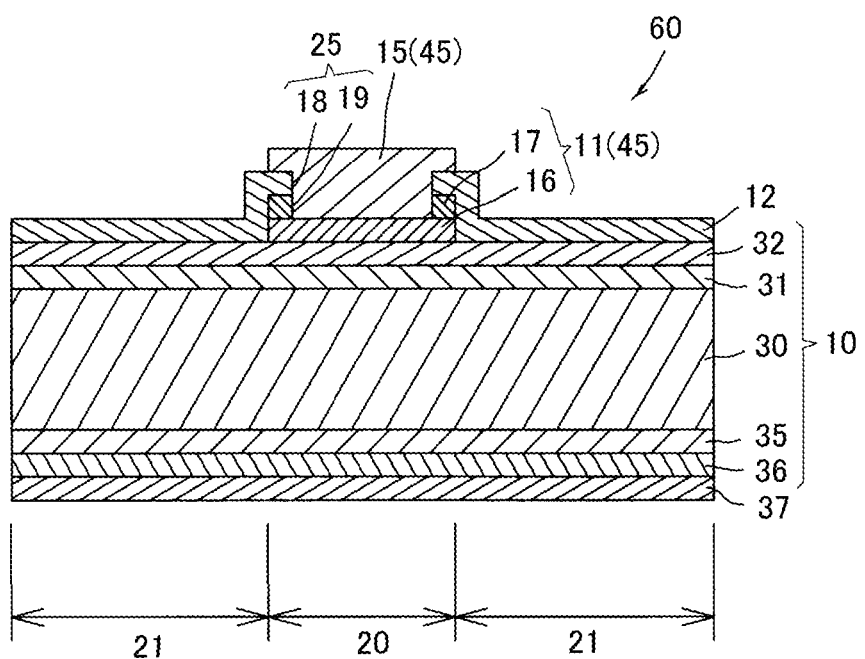
FIG. 8 is a sectional view schematically showing a crystal silicon solar cell according to a second embodiment of the present invention.
Figure 9A:
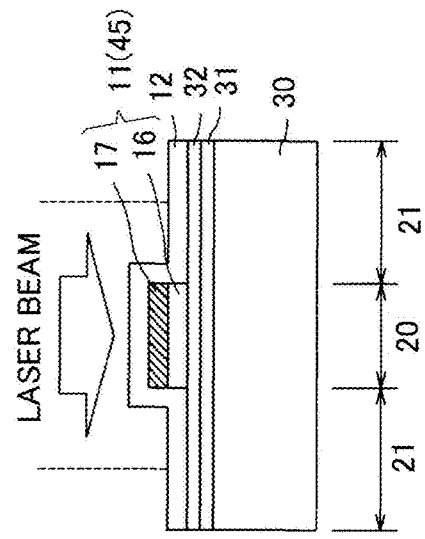
FIG. 9(a) to FIG. 9(e) each are a sectional view schematically showing a method for producing the solar cell module according to the second embodiment of the present invention, and each represent a manufacturing step. Note that a silicon-based thin film, a transparent electrode layer, and a rear surface metal electrode on a rear surface side with respect to a single crystal silicon substrate are not related to the illustrated manufacturing steps, and therefore omitted.
Figure 9B:
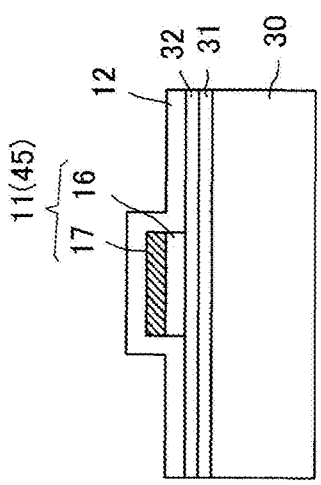
Figure 9C:
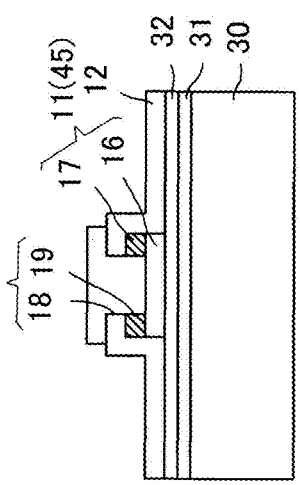
Figure 9D:
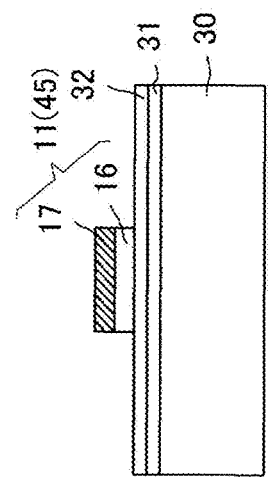
Figure 9E:
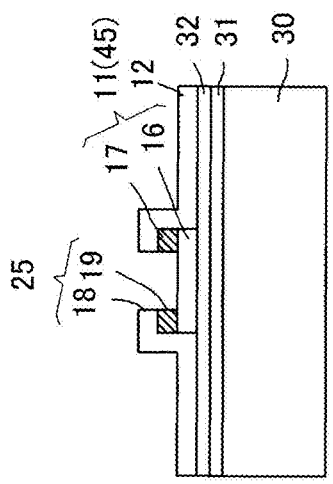

As shown in FIG. 8, in each solar cell 60 of the second embodiment, the communication hole 25 is located at the center in the width direction of an electrode layer formation area 20 (direction orthogonal to the extending direction of a collector electrode 45).

Now, a method for manufacturing the solar cell 60 of the second embodiment will be described. Steps similar to those of the first embodiment are omitted.

An electrode layer formation step shown in FIG. 9(*a*), and an insulating layer formation step shown in FIG. 9(*b*) are performed. A laser step (opening formation step) that is a characteristic of the present embodiment is performed to a laminated substrate on which an insulating layer 12 is formed.

That is, as shown in FIG. 9(*c*), a laser beam is made to irradiate from a light incident surface side to the laminated substrate, and a part of or all of the insulating layer 12 and a part of or all of a second electrode 17 are removed, so that the communication hole 25 is formed, as shown in FIG. 9(*d*).

At this time, a laser beam having a spot diameter larger than the width of an electrode layer formation area 20 (length in a direction orthogonal to the extending direction of the collector electrode 45) is used as the laser beam, as shown in FIG. 9(*c*).

As shown in FIG. 9(*c*), when a cross-section orthogonal to a first main surface of a photoelectric conversion part 10 that is a cross-section orthogonal to the extending direction of an electrode layer 11 is viewed, the laser beam is made to irradiate so as to pass through the center in the width direction of the electrode layer 11 in the electrode layer formation area 20 (direction orthogonal to the extending direction of the collector electrode 45).

More specifically, in a case where the laser beam is made to irradiate along a finger part 47, the laser beam is made to irradiate so as to pass through the center of the electrode layer formation area 20 in the cross-section orthogonal to the extending direction of the finger part 47. Additionally, in a case where the laser beam is made to irradiate along a bus bar part 46, the laser beam is made to irradiate so as to pass through the center of the electrode layer formation area 20 in the cross-section orthogonal to the extending direction of the finger part 47.

In this embodiment, a part of the insulating layer 12 and a part of the second electrode 17 are removed by utilizing power uniformity in a spot (applied portion) of the laser beam, so that the communication hole 25 is formed. Specifically, the output, the intensity, and the range of the laser beam are controlled such that the second electrode 17 is removed only at the center of the applied portion of the laser beam.

Thereafter, in the laser step, the laminated substrate on which the communication hole 25 is formed is immersed in a plating bath, and a metal layer 15 is formed on the electrode layer 11 as shown in FIG. 9(*e*) (plating step).

Subsequent to the plating step, the solar cell 60 is manufactured in a manner similar to that of the first embodiment.

In each of the above first and second embodiments, a part of the second electrode 17 is removed in the laser step. That is, the second electrode 17 is removed so as to partially remain in the laser step, but the present invention is not limited to this. All of the second electrode 17 may be removed.

Description of this case will be made as description of a solar cell module 70 of a third embodiment. Parts similar to those of the first and second embodiments are denoted by the same numerals, and description thereof is omitted.

Figure 10:
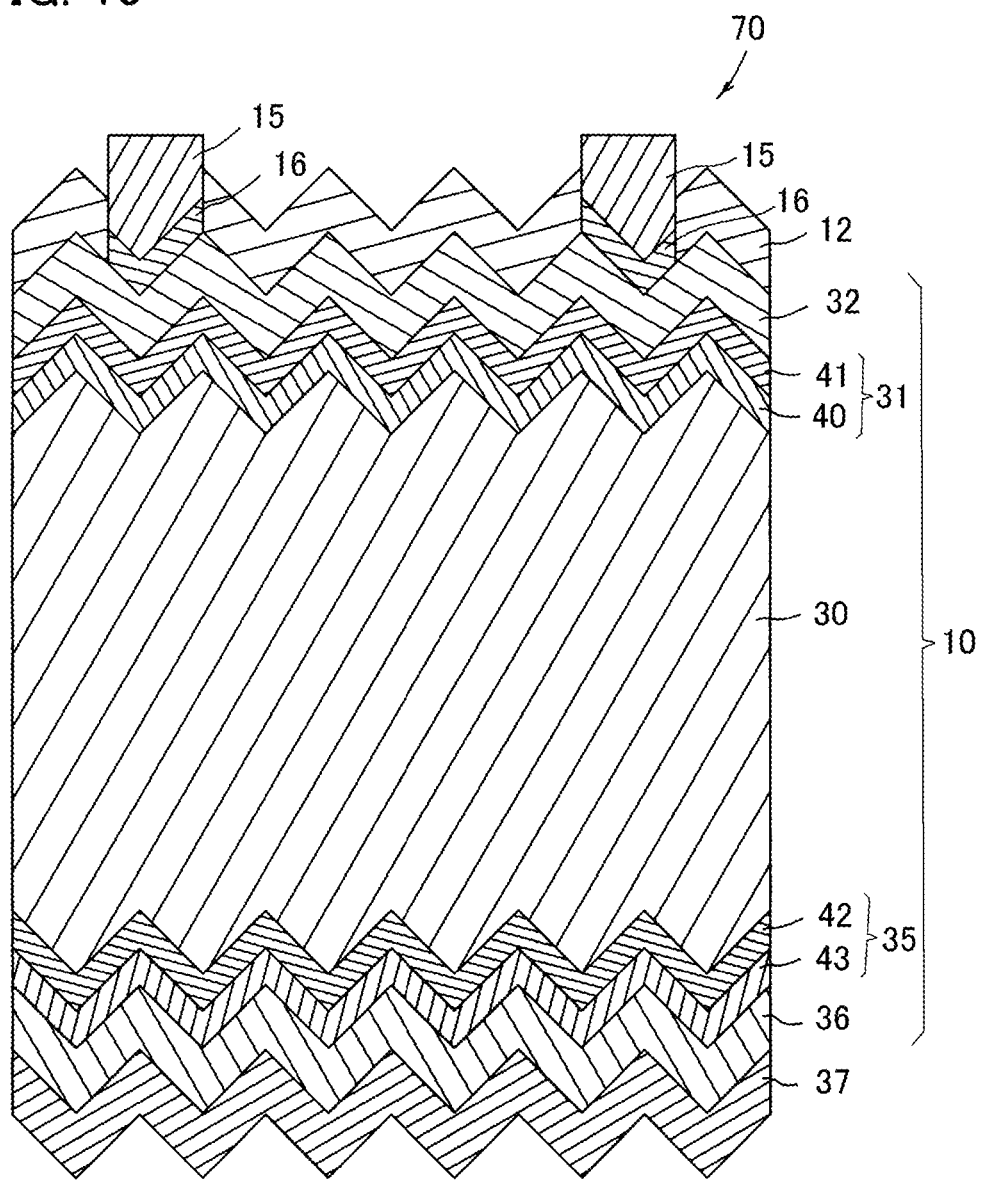
FIG. 10 is a perspective view schematically showing a crystal silicon solar cell according to a third embodiment of the present invention.

As shown in FIG. 10 in the solar cell module 70 of the third embodiment, an electrode layer 11 is formed only of a first electrode 16, and a second electrode 17 is not substantially present. That is, a metal layer 15 is directly laminated on the first electrode 16.

Now, a method for manufacturing the solar cell module 70 of the third embodiment will be described. Description of steps similar to those of the first and second embodiments is omitted.

An electrode layer formation step shown in FIG. 11(*a*), and an insulating layer formation step shown in FIG. 11(*b*) are performed, and a laser step that is a characteristic of the present embodiment is performed to a laminated substrate on which an insulating layer 12 is formed.

That is, as shown in FIG. 11(*c*), a laser beam is made to irradiate from a light incident side to the laminated substrate on which the insulating layer 12 is formed, and a part of or all of the insulating layer 12 is removed, so that an opening 18 is formed, as shown in FIG. 11(*d*).

At this time, the laser beam is made to irradiate to the laminated substrate so as to include all of the second electrode 17 as shown in FIG. 11(*c*), and all of the second electrode 17 is substantially removed as shown in FIG.

11(d). Accordingly, the opening 18 is formed on the whole surface of the insulating layer 12 in an electrode layer formation area 20.

Figure 11A:
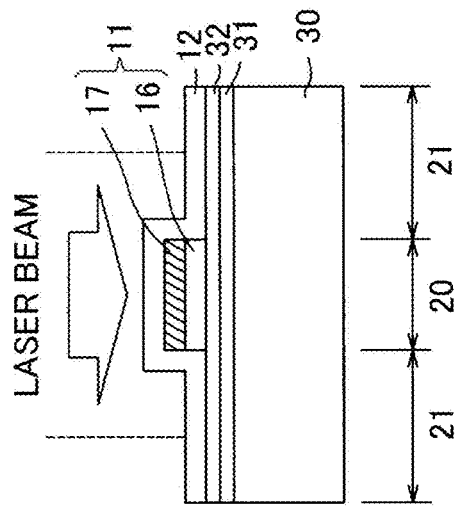
FIG. 11(a) to FIG. 11(e) each are a sectional view schematically showing a method for producing the solar cell module according to the third embodiment of the present invention, and each represent a manufacturing step. Note that a silicon-based thin film, a transparent electrode layer, and a rear surface metal electrode on a rear surface side with respect to a single crystal silicon substrate are not related to the illustrated manufacturing steps, and therefore omitted.
Figure 11B:
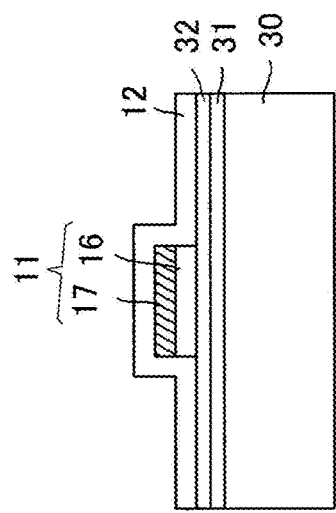
Figure 11D:
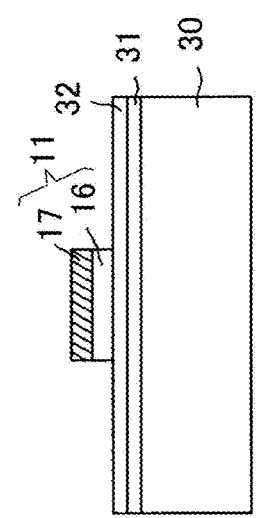
Figure 11C:
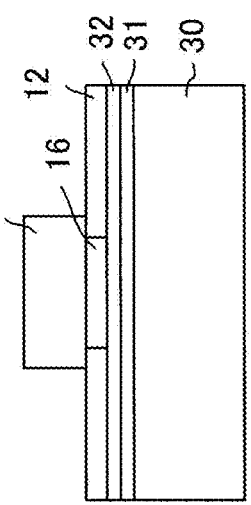
Figure 11E:
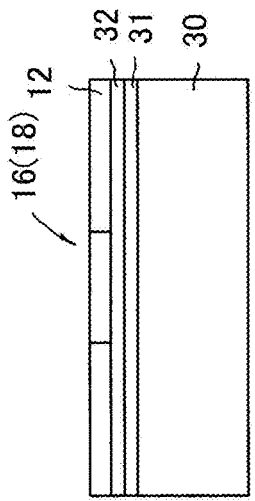

Then, after the laser step, the laminated substrate on which the opening 18 is formed is immersed in a plating bath, and the metal layer 15 is formed on the first electrode 16, as shown in FIG. 11(e) (plating step).

At this time, the metal layer 15 is formed, with the first electrode 16 exposed to the bottom of the opening 18 as a seed layer.

According to the method for manufacturing the solar cell module 70 of the third embodiment, all of the second electrode 17 is substantially removed in the laser step, and hence a resistance loss due to the second electrode 17 is not caused. Therefore, even the second electrode 17 having low conductivity or being an insulator can be used.

Now, a solar cell module 100 of a fourth embodiment will be described. Parts similar to those of the first, second and third embodiments are denoted by the same numerals, and description thereof is omitted.

Figure 12:
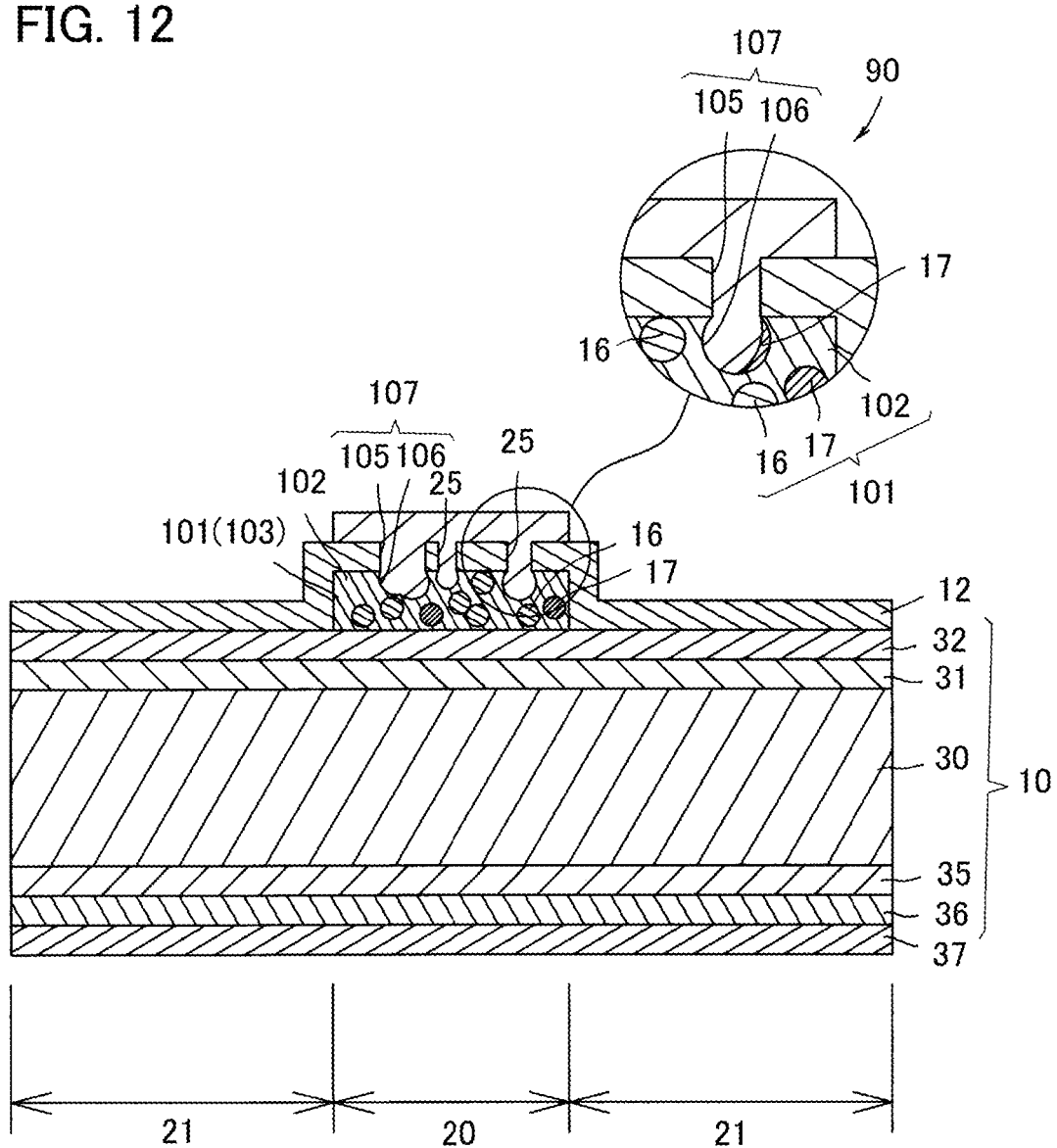
FIG. 12 is a sectional view schematically showing a crystal silicon solar cell according to a fourth embodiment of the present invention.
Figure 13A:
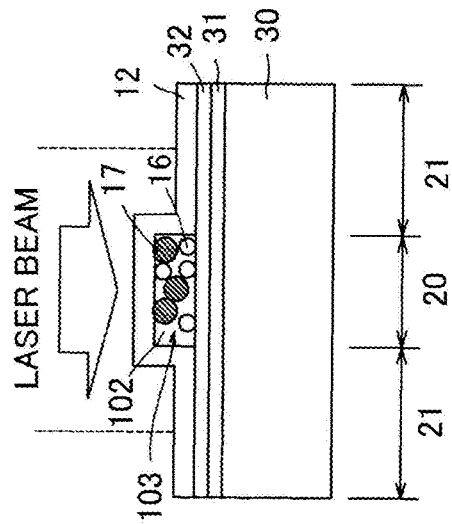
FIG. 13(a) to FIG. 13(e) each are a sectional view schematically showing a method for producing the solar cell module according to the fourth embodiment of the present invention, and each represent a manufacturing step. Note that a silicon-based thin film, a transparent electrode layer, and a rear surface metal electrode on a rear surface side with respect to a single crystal silicon substrate are not related to the illustrated manufacturing steps, and therefore omitted.
Figure 13B:
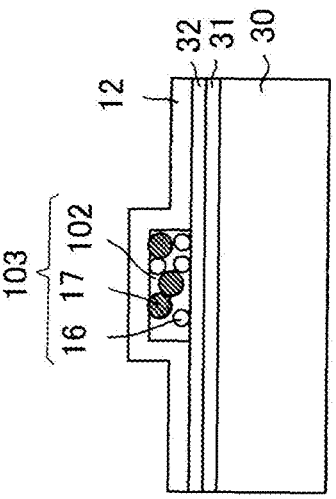
Figure 13C:
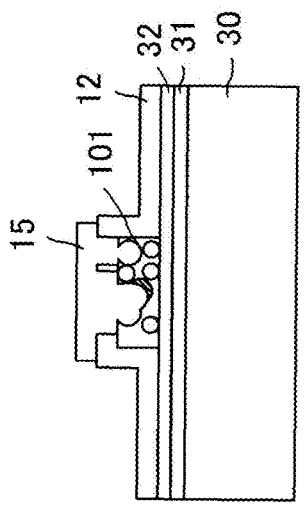
Figure 13D:
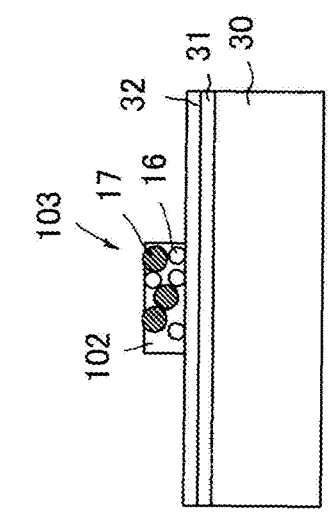
Figure 13E:
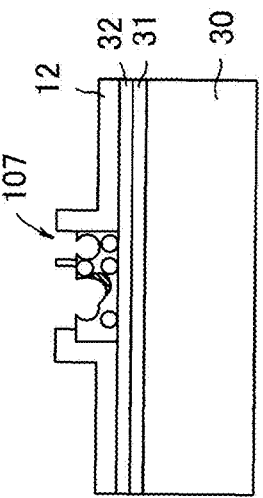

As shown in FIG. 12, an electrode layer 101 of the fourth embodiment is formed by solidifying a paste material 103 (inclusive material).

As shown in FIG. 12, the paste material 103 includes first electrodes 16, and second electrodes 17 (removal-target bodies). Specifically, the paste material 103 is formed by mixing the particulate first electrodes 16 with the particulate second electrodes 17 (removal-target bodies), and integrating these electrodes by a paste 102.

Figure 14:
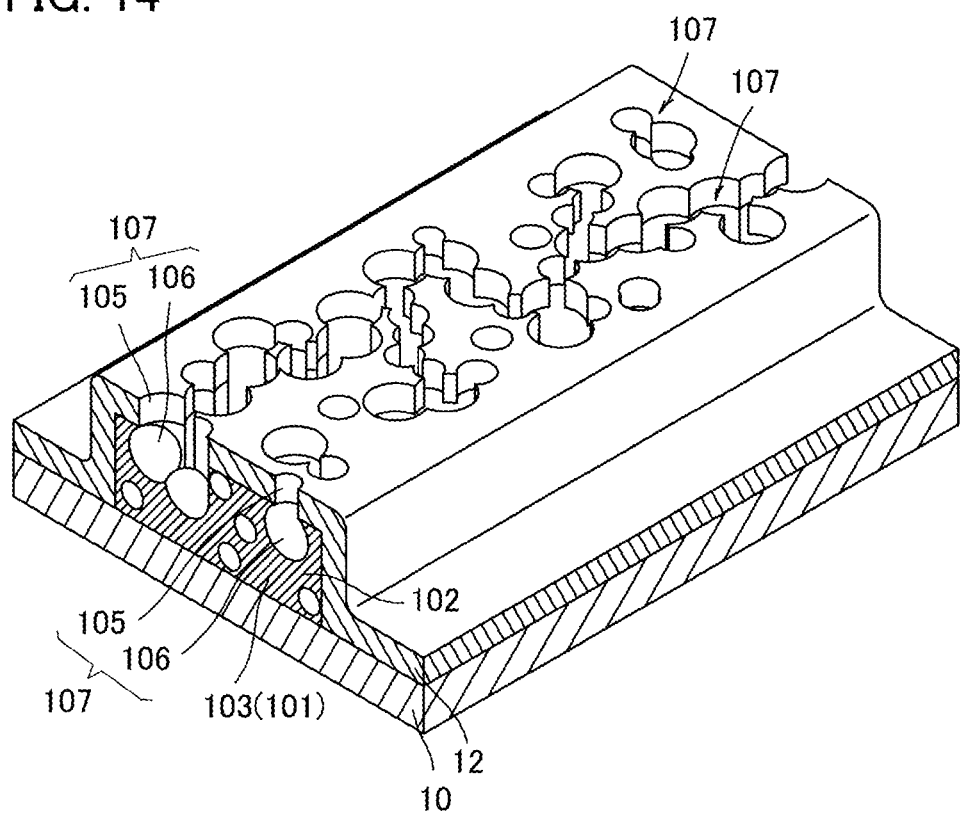
FIG. 14 is a partially broken perspective view representing a condition of the crystal silicon solar cell in the laser step of FIG. 13(c).

As shown in FIG. 14, the electrode layer 101 includes a plurality of holes 106 having different shapes.

The holes 106 are bottomed holes each extending from the outside of the electrode layer 101 toward the inside, similarly to the hole 19 of the first embodiment.

An insulating layer 12 includes a plurality of openings 105 different in shape, corresponding to the holes 106 of the electrode layer 101.

The openings 105 are through holes each passing through in a thickness direction of the insulating layer 12, similarly to the opening 18 of the first embodiment.

Each of the holes 106 of the electrode layer 101 is communicated with a corresponding one of the openings 105 of the insulating layer 12, thereby forming a single communication hole 107.

The paste 102 is a known bonding agent, and can hold the first electrodes 16 (first electrode materials) and the second electrodes 17 (second electrode materials) in a paste state by mixing the first electrodes 16 with the second electrodes 17.

An optimum mixing ratio of the first electrodes 16 (first electrode materials) and the second electrodes 17 (second electrode materials) in the paste material 103 depends on a condition of a laser beam to be irradiated, and "positions of the second electrodes 17" that are present in the electrode layer 101.

Therefore, although it cannot be said definitely, the volume ratio of the second electrodes 17 (second electrode materials) is preferably not less than 30% and not more than 90% of the total volume ratio of both of them (the first electrodes 16 and the second electrodes 17), is more preferably not less than 40% and not more than 80%, and is particularly preferably not less than 50% and not more than 70%.

The "positions of the second electrodes 17" means a case where the second electrodes 17 in the electrode layer 101 are formed near the surface of the electrode layer 101 (surface on the first main surface side), and a case where the fine particulate second electrodes 17 (second electrode materials) are mixed in the paste material 103 like in a case of using a printing method to laminate the second electrodes 17.

The volume ratio of the second electrodes 17 (second electrode materials) is set to 30% or more, so that the openings 105 can be formed in the insulating layer 12 to such a degree as to effectively cause plating.

Additionally, the volume ratio of the second electrodes 17 (second electrode materials) is set to 90% or less, so that the amount of the first electrodes 16 (first electrode materials) serving as a seed layer can be sufficiently ensured, for example, even in a case where the output of a laser beam is large. Therefore, it is possible to suppress contact resistance between the electrode layer 101 and a transparent electrode layer 32, or to lower the resistance of the electrode layer 101.

In a case where the first electrodes 16 and the second electrodes 17 are mixed in the paste material 103, sometimes the first electrodes 16 and the second electrodes 17 are substantially evenly mixed in the paste material 103, or sometimes the first electrodes 16 are largely present near the surface while the second electrodes 17 are not present near the surface.

In the former case, for example, even when the second electrodes 17 are covered with the paste 102, the general paste 102 often transmits light to some extent. Therefore, in the former case, it is considered that a laser beam is sufficiently irradiated to the second electrodes 17, and it is possible to form the openings 105 by removing the second electrodes 17.

On the other hand, in the latter case, the second electrodes 17 are present at positions shaded by the first electrodes 16. Therefore, in the latter case, it is considered that a laser beam is unlikely to reach the second electrodes 17, and the second electrodes 17 are removed by increasing the output of the laser beam.

In a case where the particulate first electrodes 16 and/or second electrodes 17 are used by a printing method, particles each having some extent of a particle diameter or less are preferably used when the thinning of the comb electrode is taken into account.

From a viewpoint of securing a sufficient conductive path, the particle diameter of each particle used in the first electrodes 16 is preferably 50 nm or more, is more preferably 500 nm or more, and is particularly preferably 1 μm or more.

From a viewpoint of thinning, the particle diameter of each particle used in the first electrodes 16 is preferably 10 μm or less, is more preferably 7 μm or less, and is particularly preferably 5 μm or less.

From a viewpoint of forming the openings 105 each having a sufficient size, the particle diameter of each particle used in the second electrodes 17 is preferably 50 nm or more, is more preferably 500 nm or more, and is particularly preferably 1 μm or more.

From a viewpoint of thinning, the particle diameter of each particle used in the second electrodes 17 is preferably 10 μm or less, is more preferably 5 μm or less, and is particularly preferably 3 μm or less.

The method for forming the electrode layer 101 is not limited as long as the paste material 103 is used. However, from a viewpoint of productivity, a forming method by a printing method is preferable.

Now, a method for manufacturing the solar cell module 100 of the fourth embodiment will be described. Steps similar to those of the first to third embodiments will be briefly described.

First, a photoelectric conversion part formation step for forming a photoelectric conversion part 10 is performed. After a transparent electrode layer formation step in the photoelectric conversion part formation step, the electrode layer 101 is formed on a light incident side transparent electrode layer 32 (electrode layer formation step), as shown in FIG. 13(*a*).

At this time, the paste material 103 having the first electrodes 16 and the second electrodes 17 is applied on the light incident side transparent electrode layer 32 by a printing method, and the first electrodes 16 and the second electrodes 17 are formed at the same time.

After the electrode layer formation step, an insulating layer formation step is performed. As shown in FIG. 13(*b*), the insulating layer 12 is formed on a laminated substrate on which the electrode layer 101 is formed.

After the insulating layer formation step, a laser step that is a characteristic of the present embodiment is performed to the laminated substrate on which the insulating layer 12 is formed.

That is, a laser beam is made to irradiate from the light incident side to the laminated substrate on which the insulating layer 12 is formed, as shown in FIG. 13(*c*).

Consequently, as shown in FIG. 13(*d*), a part of or all of the insulating layer 12 and a part of or all of second electrodes 17 are removed, so that the plurality of openings 105 and the plurality of holes 106 are formed. That is, a plurality of communication holes 107 are formed on the laminated substrate covered with the insulating layer 12.

At this time, as shown in FIG. 13(*c*), while the laser beam is mainly irradiated along the second electrodes 17 of the patterned electrode layer 101, the laser beam is made to irradiate the photoelectric conversion part 10 in an electrode layer non-formation area 21 so as to cover all of the electrode layer 101 in an electrode layer formation area 20. That is, the laser beam is made to irradiate so as to include all of the second electrodes 17, to remove the second electrodes 17, as shown in FIG. 13(*d*).

At this time, the laser beam removes only a portion of the second electrodes 17 mainly located on the surface side (first main surface side) in the paste 102, and the plurality of openings 105 are formed in the insulating layer 12 mainly with the portion of the second electrodes 17 in the paste as the center.

That is, the plurality of holes 106 different in shape are formed in the electrode layer 101, and each of the holes 106 is communicated with a corresponding one of the openings 105, thereby forming each communication hole 107.

Thereafter, after the laser step, the laminated substrate on which the openings 105 are formed is immersed in a plating bath, and a metal layer 15 is formed on the first electrodes 16 as shown in FIG. 13(*e*) (plating step).

At this time, the metal layer 15 is formed with the first electrodes 16 as a seed layer, and is filled in each communication hole 107.

In a case where the first electrodes 16 and the second electrodes 17 are mixed in the paste and formed at the same time like this embodiment, the first electrodes 16 and the second electrodes 17 are generally evenly dispersed.

In such a case, in a case where all of the second electrodes 17 are removed by a high output laser beam, there is a possibility that an uppermost surface layer (e.g., the transparent electrode layer 32) of the photoelectric conversion part 10 located just under the paste is exposed. For example, in a case where a material having coarse unevenness is used as a conductive seed like Patent Document 5 or the like, there is a possibility that the plating solution penetrates in the conductive seed, a conductive substrate (photoelectric conversion part) is damaged, and a solar cell characteristic is lowered. Similarly, in a case where the uppermost surface layer of the photoelectric conversion part is exposed as described above, there is a possibility that the uppermost surface is damaged by the plating solution, and a solar cell characteristic is lowered.

On the other hand, in this embodiment, also after the irradiation by the laser beam, the surface of the photoelectric conversion part 10 in the electrode layer formation area 20 is covered with the electrode layer 101. That is, the communication holes 107 are bottomed holes, and therefore the plating solution does not enter the communication holes 107, and the surface of the photoelectric conversion part 10 is not exposed to the plating solution, so that it is possible to further suppress the damage of the photoelectric conversion part 10 by the plating solution.

In a case where the paste having the first electrodes 16 and the second electrodes 17, or the like is used as the electrode layer 101 after the irradiation by the laser beam, part of the second electrodes 17 preferably remain.

In the solar cell module 100 of the fourth embodiment, the first electrodes 16 and the second electrodes 17 are evenly mixed. However, the present invention is not limited to this. In the electrode layer formation step, the paste material 103 may be applied such that the first electrodes 16 and/or the second electrodes 17 are locally aggregated.

The second electrodes 17 are preferably aggregated at the center of the paste material 103 in the electrode layer formation area 20.

Consequently, in the laser step, the openings 105 can be formed at the center of the electrode layer formation area 20 in the insulating layer 12.

Therefore, in the plating step, the metal layer 15 can be formed mostly in the electrode layer formation area 20.

The method for aggregating the first electrodes 16 and the second electrodes 17 is not particularly limited. The first electrodes 16 and the second electrodes 17 may be aggregated by utilizing the viscosity of the paste 102, or may be aggregated by utilizing the particle diameters or the specific gravity of the first electrodes 16 and the second electrodes 17. Additionally, the first electrodes 16 and the second electrodes 17 may be aggregated by controlling a drying temperature.

In the above embodiments, all of the second electrode 17 is removed in a thickness direction by the laser beam in the laser step. However, the present invention is not limited to this, as long as the opening 18 can be formed in the insulating layer 12.

Figure 15A:
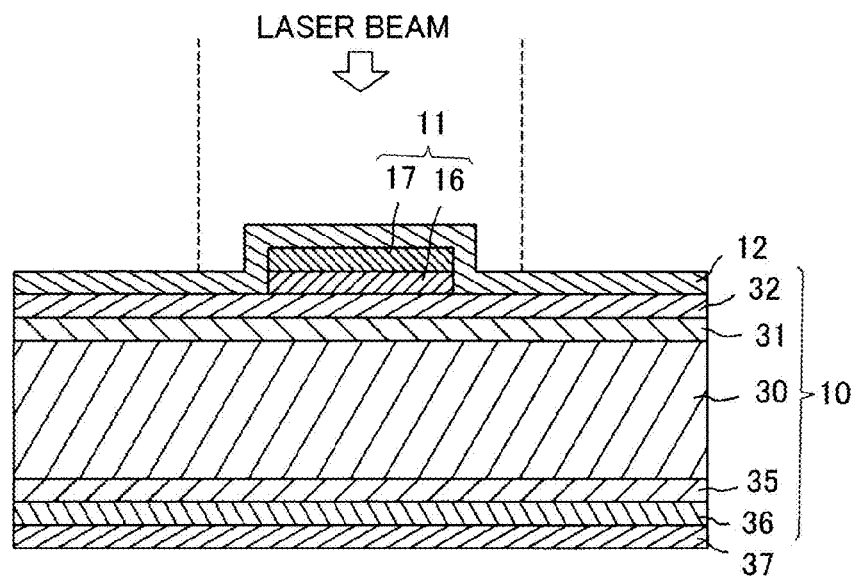
Figure 15B:
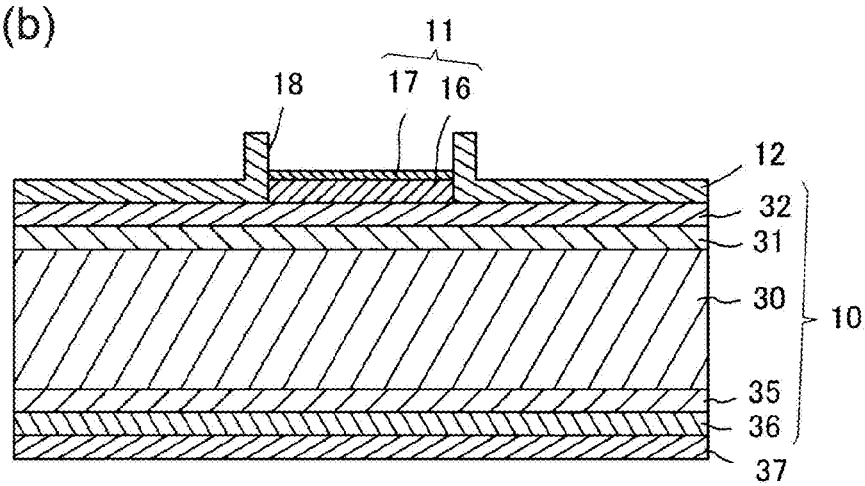

That is, all of the second electrode 17 does not necessarily need to be removed by the laser beam, but only a part of the second electrode 17 may be removed in the laser step, as shown in FIG. 15. That is, the second electrode 17 may finally remain. In this case, the bottom of the opening 18 is the second electrode 17.

In a case of the above embodiment, the power of a laser for application has preferably such power as not to damage the photoelectric conversion part 10, and therefore a laser having some extent of low power is used. Therefore, there is an enough possibility that only a part of the second electrode 17 is removed, or dissolved to form the opening 18 in the insulating layer 12.

In the above embodiments, when the solar cell module 1 is manufactured, the laser beam having the predetermined wavelength and the predetermined power density is selected to be used. However, the present invention is not limited to this. For example, in a case where the laser beam is controlled so as not to go beyond the electrode layer 11 in the laser step, a laser beam having a wavelength and power density other than those derived by the above selection can be used.

Specifically, in a case of using an IR laser having a wavelength of 1064 nm, power density is preferably not less than 100 $\mu W/\mu m^2$ and not more than 1500 $\mu W/\mu m^2$, and is particularly preferably not less than 400 $\mu W/\mu m^2$ and not more than 600 $\mu W/\mu m^2$.

Additionally, in a case of using a SHG laser having a wavelength of 532 nm, power density is preferably not less than 100 $\mu W/\mu m^2$ and not more than 1500 $\mu W/\mu m^2$, is more preferably not less than 200 $\mu W/\mu m^2$ and not more than 500 $\mu W/\mu m^2$, and is particularly preferably not less than 200 $\mu W/\mu m^2$ and not more than 300 $\mu W/\mu m^2$.

In the above embodiments, the insulating layer 12 that belongs to the electrode layer non-formation area 21 is not removed, in the step subsequent to the plating step. However, the present invention is not limited to this. The insulating layer 12 may be removed. That is, an insulating layer removal step may be performed after the metal layer 15 is formed (after the plating step).

Particularly, in a case where a material having large light absorption is used as the insulating layer 12, the insulating layer removal step is preferably performed. Reduction in a solar cell characteristic due to the light absorption of the insulating layer 12 can be suppressed by performing the insulating layer removal step.

A method for removing the insulating layer 12 is suitably selected according to the characteristic of the material of the insulating layer 12. For example, the insulating layer 12 can be removed by chemical etching or mechanical polishing. Additionally, an ashing method is also applicable depending on a material. At this time, from a viewpoint of improving a light capturing effect, all of the insulating layer 12 on the electrode layer non-formation area 21 is preferably removed.

Like the above embodiments, in a case where a material having small light absorption is used as the insulating layer 12, the insulating layer removal step does not need to be performed.

The above embodiments mainly cover a case where the metal layer 15 is provided on the light incident side (first main surface side) of each crystal silicon solar cell 2 that is the heterojunction solar cell. However, the present invention is not limited to this, and a similar collector electrode 45 may be also formed on the rear surface (second main surface side) of each crystal silicon solar cell 2.

In the above embodiments, the heterojunction solar cell is used. However, the present invention is not limited to this, and is applicable to a case of using other solar cell.

The present invention is applicable to various solar cells, for example, a crystal silicon solar cell other than the heterojunction solar cell, a solar cell using a semiconductor substrate other than a silicon-based semiconductor substrate such as GaAs, a silicon-based thin film solar cell in which a transparent electrode layer is formed on a pin junction or a pn junction of an amorphous silicon-based thin film or a crystal silicon-based thin film, a compound semiconductor solar cell such as CIS and CIGS, or an organic thin film solar cell such as a dye-sensitized solar cell and an organic thin film (conductive polymer).

Examples of the silicon-based thin film solar cell include, for example, an amorphous silicon-based thin film solar cell having an amorphous intrinsic (i-type) silicon thin film between a p-type thin film and an n-type thin film, and a crystal silicon-based semiconductor solar cell having a crystal intrinsic silicon thin film between a p-type thin film and an n-type thin film. Additionally, a tandem type thin film solar cell formed by laminating a plurality of pin junctions is also suitable.

In the above embodiments, the rear surface metal electrode 37 is provided on the outside of the rear surface side transparent electrode layer 36. However, the present invention is not limited to this. The rear surface side transparent electrode layer 36 also functions as an electrode, and therefore the rear surface metal electrode 37 does not necessarily need to be provided.

In the above embodiments, the solar cell module including a plurality of solar cell is described. However, the present invention is not limited to this, and a solar cell module including a single solar cell may be employed.

In the above embodiments, one end of each wiring member 3 is connected to one of the solar cells 2, and the other end is connected to other solar cell 2. However, the present invention is not limited to this, and the other end may be connected to an external circuit.

EXAMPLES

Hereinafter, the present invention will be specifically described, taking examples regarding to a heterojunction solar cell. However, the present invention is not limited to the following examples. In each of the following examples, materials used as the first electrode 16 and the second electrode 17 were selected from conditions and materials studied in Table 1 and Table 2, and an electrode layer was produced.

Example 1

A heterojunction solar cell of Example 1 was manufactured in the following manner.

As the one conductivity-type single crystal silicon substrate 30, an n-type single crystal silicon wafer whose incident surface has a plane orientation of (100) and whose thickness is 200 $\mu m$ was used. This silicon wafer was immersed in a 2 wt. % HF aqueous solution for three minutes, a silicon oxide film on the surface was removed, and thereafter the wafer was rinsed with ultrapure water twice. This silicon substrate was immersed in a 5/15 wt. % potassium hydroxide (KOH)/isopropyl alcohol aqueous solution held at 70° C., for 15 minutes, and texture was formed by etching the surface of the wafer. Thereafter, the wafer was rinsed with ultrapure water twice. When the surface of the wafer was observed by using an atomic force microscope (AFM manufactured by Pacific Nanotechnology Inc.), the progress of etching was most remarkable on the surface of the wafer, and pyramidal texture having an exposed (111) plane was formed.

The wafer obtained after etching was introduced in a CVD apparatus, and i-type amorphous silicon was formed on the light incident side of the wafer as the intrinsic silicon-based thin film 40 so as to have a film thickness of 5 nm.

The film formation conditions of the i-type amorphous silicon were as follows: substrate temperature: 150° C., pressure: 120 Pa, $SiH_4/H_2$ flow ratio: 3/10, and supplying power density: 0.011 $W/cm^2$.

The film thickness of a thin film in this example is a value calculated from a film forming rate obtained by measuring the film thickness of a thin film formed on a glass substrate in the same condition by a spectroscopic ellipsometry (product name: M2000, manufactured by J. A. Woollam Co., Inc.).

On an i-type amorphous silicon layer 40, p-type amorphous silicon was formed as the opposite conductivity-type silicon-based thin film 41 so as to have a film thickness of 7 nm. The film formation conditions of a p-type amorphous silicon layer 3a were as follows: substrate temperature: 150° C., pressure: 60 Pa, $SiH_4/B_2H_6$ flow ratio: 1/3, and supplying power density: 0.01 $W/cm^2$.

The $B_2H_6$ gas flow rate mentioned in the above is a flow rate of diluent gas having a $B_2H_6$ concentration diluted to 5000 ppm by $H_2$.

Then, an i-type amorphous silicon layer was formed on the rear surface side of the wafer as the intrinsic silicon-based thin film 42 so as to have a film thickness of 6 nm. The film formation condition of the i-type amorphous silicon layer 42 was similar to the film formation condition of the above i-type amorphous silicon layer 40.

An n-type amorphous silicon layer was formed on the i-type amorphous silicon layer 42 as the one conductive type silicon-based thin film 43 so as to have a film thickness of 4 nm. The film formation conditions of the one conductive type silicon-based thin film 43 (n-type amorphous silicon layer) were as follows: substrate temperature: 150° C., pressure: 60 Pa, $SiH_4/PH_3$ flow ratio: 1/2, and supplying power density: 0.01 $W/cm^2$. The $PH_3$ gas flow rate mentioned in the above is a flow rate of diluent gas having a $PH_3$ concentration diluted to 5000 ppm by $H_2$.

As each of the transparent electrode layers 32 and 36, indium tin oxide (ITO, refractive index: 1.9) was formed on the amorphous silicon layer so as to have a film thickness of 100 nm. By using indium oxide as a target, application was performed with a power density of 0.5 $W/cm^2$ in an argon atmosphere having a substrate temperature of a room temperature and a pressure of 0.2 Pa, thereby forming the transparent electrode layers 32 and 36.

On the rear surface side transparent electrode layer 36, silver was formed as the rear surface metal electrode 37 by a sputtering method so as to have a film thickness of 500 nm.

An electrode layer having the first electrode 16 and the second electrode 17 in this order was formed on the light incident side transparent electrode layer 32 by using masks by a sputtering method.

Silver (Ag) of 100 nm and chromium (Cr) of 50 nm were formed as the first electrode 16 and the second electrode 17, respectively, so as to have comb-shaped patterns.
The width of a bus bar part in each comb-shaped pattern was 1 mm, and the width of a finger part was 80 µm.

After the first electrode 16 and the second electrode 17 were formed, the laminated substrate was placed in the CVD apparatus, and a silicon oxide layer (refractive index: 1.5) was formed on the light incident surface side as the insulating layer 12 so as to have a thickness of 80 nm by a plasma CVD method.

The film formation conditions of the insulating layer 12 were as follows: substrate temperature: 135° C., pressure: 133 Pa, $SiH_4/CO_2$ flow ratio: 1/20, and supplying power density: 0.05 $W/cm^2$ (frequency: 13.56 MHz).

At this time, the above insulating layer 12 was formed on the substantially whole surface in the electrode layer formation area 20 and the substantially whole surface in the electrode layer non-formation area 21, on the one main surface side of the photoelectric conversion part 10.

Thereafter, a SHG laser having a power density of 290 µW/µm², a wavelength of 532 nm, and a spot diameter of 100 µm was irradiated so as to mostly trace the comb-shaped pattern to remove the second electrode 17, and an opening was formed in the silicon oxide layer in an area where the second electrode 17 had been formed.

At this time, a part of the second electrode 17 remained on the first electrode 16, and a part of the first electrode 16 was exposed. Thereafter, the wafer obtained after the insulating layer 12 was formed was introduced in a hot air circulating oven, and annealing treatment was performed at 180° C. in an atmospheric condition for 20 minutes. Thus, the laminated substrate obtained after the annealing treatment was placed in a plating tank.

As the plating solution, a solution that was obtained by adding an additive (manufactured by C. Uyemura & Co., Ltd., item number: ESY-2B, ESY-H, ESY-1A) to a solution obtained by preparing copper sulfate pentahydrate, sulfuric acid, and sodium chloride so as to have concentrations of 120 g/l, 150 g/l, and 70 mg/l, respectively, was used. By using this plating solution, plating was performed in a condition of a temperature of 40° C. and a current of 3 $A/dm^2$, and copper was evenly deposited on the first electrode 16 and the second electrode 17 as the metal layer 15 so as to have a thickness of about 10 µm. Deposition of copper in an area where the first electrode 16 was not formed was hardly seen. Thereafter, the silicon wafer at a cell outer peripheral part was removed by a laser beam machine by a width of 0.5 mm, so that a heterojunction solar cell of the present invention was produced.

Example 2

A solar cell was produced in a manner similar to that of Example 1 except that tin (Sn) was formed as the second electrode so as to have a thickness of 50 nm, and thereafter an IR laser having a power density of 560 µW/µm², a wavelength of 1064 nm, and a spot diameter of 100 µm was irradiated so as to mostly trace a comb-shaped pattern.

Example 3

A solar cell was produced in a manner similar to that of Example 1 except that titanium (Ti) was formed as the second electrode so as to have a thickness of 50 nm, and thereafter an IR laser having a power density of 560 µW/µm², a wavelength of 1064 nm, and a spot diameter of 100 µm was irradiated so as to mostly trace a comb-shaped pattern.

Comparative Example 1

As Comparative Example 1, a heterojunction solar cell was produced in a manner similar to that of Example 1 except that only a silver (Ag) paste (first electrode) was formed as an electrode layer by a printing method, an insulating layer was not formed, and a metal layer by plating was not formed.

Comparative Example 2

A solar cell was produced in a manner similar to that of Example 1 except that the second electrode 17 was not formed, and a SHG laser having a power density of 680 µW/µm², a wavelength of 532 nm, and a spot diameter of 100 µm was irradiated so as to mostly trace a comb-shaped pattern. In Comparative Example 2, an insulating layer 12 was formed so as to cover a first electrode 16, and a laser beam was irradiated in a condition in which silver (Ag)

being the first electrode 16 can be removed, in order to remove the insulating layer 12.

Table 3 shows the production conditions of the heterojunction solar cells of the above examples and comparative examples. Furthermore, Table 3 shows measured results of solar cell characteristics (open-circuit voltage (Voc), short-circuiting current density (Jsc), fill factors (FF), and conversion efficiencies (Eff) of the heterojunction solar cells of the above respective examples and comparative examples.

TABLE 3

| | First electrode | Second electrode | Laser | Jsc (mA/cm$^2$) | Voc (V) | FF (%) | Eff (%) |
|---|---|---|---|---|---|---|---|
| Example 1 | Ag | Cr | SHG laser 290 µW/µm2 | 36.59 | 0.732 | 79.78 | 21.37 |
| Example 2 | Ag | Sn | IR laser 560 µW/µm2 | 36.51 | 0.734 | 79.65 | 21.34 |
| Example 3 | Ag | Ti | IR laser 560 µW/µm2 | 36.63 | 0.730 | 79.72 | 21.32 |
| Comparative Example 1 | Ag paste | — | — | 36.15 | 0.730 | 78.95 | 20.83 |
| Comparative Example 2 | Ag | — | SHG laser 680 µW/µm2 | 36.47 | 0.681 | 76.45 | 18.99 |

Compared to Comparative Example 1, Jsc in each example increases. It is considered that this is because the insulating layer 12 is not formed in Comparative Example 1, while the insulating layer 12 is formed in each example, and therefore an antireflection effect is obtained.

Additionally, in each of Examples 1 to 3, the metal layer 15 made of bulk copper (Cu) is formed as an electrode by a plating method. Therefore, series resistance in the collector electrode 45 is low. On the other hand, in Comparative Example 1, silver paste is used. Therefore, the silver paste has higher series resistance than the bulk copper (Cu). Therefore, it is considered that a higher value of the curvature factor is obtained in Example 1.

On the other hand, when each example is compared with Comparative Example 2, a Voc and a curvature factor in Comparative Example 2 are largely lower than those of each example, and a conversion efficiency reduces accompanying this. This is considered as follows. In Comparative Example 2, the second electrode 17 is not provided, the insulating layer 12 is formed on the first electrode 16, and an opening needs to be formed in the insulating layer 12. Therefore, a high power laser beam is made to irradiate to the insulating layer 12. This causes the PN junction part of the photoelectric conversion part 10 to be more damaged as compared to the examples.

If a laser beam is made to irradiate only onto the first electrode 16, and the insulating layer 12 is removed in Comparative Example 2, it is considered that a solar cell characteristic excellent to some extent can be obtained. However, it is considered that it is difficult to irradiate a laser beam only onto a comb electrode pattern of the light incident surface of the solar cell.

When Comparative Example 1 is compared with Comparative Example 2, a characteristic in Comparative Example 2 is lower than that of Comparative Example 1 using the paste having high resistance, despite the use of bulk copper (Cu) by a plating method in Comparative Example 2. As described above, it is considered that this is because a Voc and a curvature factor are reduced by irradiating the laser beam and damaging the photoelectric conversion part 10 when the opening is formed in the insulating layer 12 located on the first electrode 16.

As described using the examples, according to the present invention, it is possible to provide a high output solar cell at a low cost.

EXPLANATION OF REFERENCE SIGNS 1, 60, 70, 80, 100: Solar cell module
2, 60: Crystal silicon solar cell (solar cell)
3: Wiring member
10: Photoelectric conversion part
11, 101: Electrode layer
12: Insulating layer
15: Metal layer
16: First electrode
17: Second electrode (removal-target body)
18, 105: Opening
19, 106: Hole
25, 107: Communication hole
32: Light incident side transparent electrode layer (transparent electrode layer)

The invention claimed is:

1. A method for manufacturing a solar cell having at least a first electrode, a metal layer, and an insulating layer on a first main surface side of a photoelectric conversion part extending in a planar state, the first main surface side of the photoelectric conversion part comprising a transparent electrode layer, the method comprising:
   a laminated electrode layer formation step of forming on the transparent electrode layer a laminated electrode layer comprising the first electrode and a removal-target body positioned above the first electrode, in this order;
   an insulating layer formation step of forming the insulating layer over the transparent electrode layer and the electrode layer positioned above the transparent electrode layer so as to cover at least the removal-target body;
   an opening formation step of forming an opening in the insulating layer by removing at least a portion of the removal-target body and a portion of the insulating layer positioned above the removal-target body so as to expose the first electrode; and
   a metal layer formation step of forming the metal layer over the first electrode layer so as to fill in the opening in the insulating layer by a plating method, in this order, wherein
   in the opening formation step, at least a portion of the removal-target body is removed by irradiation by a laser beam, so that the opening in the insulating layer is formed.

2. The method for manufacturing a solar cell according to claim 1,
wherein the photoelectric conversion part is provided with a transparent electrode layer on an outermost surface on the first main surface side, and
in the insulating layer formation step, the insulating layer is formed such that a major part of an outer surface of the transparent electrode layer is not exposed and the outer surface is with respect to the photoelectric conversion part.

3. The method for manufacturing a solar cell according to claim 1,
wherein the removal-target body is electroconductive.

4. The method for manufacturing a solar cell according to claim 1,
wherein the laser beam is made to irradiate with output that does not substantially influence the photoelectric conversion part.

5. The method for manufacturing a solar cell according to claim 4,
wherein in the opening formation step, an electrode layer formation area where the electrode layer is formed, and an electrode layer non-formation area other than the electrode layer formation area are present when the photoelectric conversion part is planarly viewed, and
the laser beam is made to irradiate the electrode layer formation area and the electrode layer non-formation area.

6. The method for manufacturing a solar cell according to claim 1,
wherein in the opening formation step, the opening is formed by irradiation by a laser beam having a wavelength of not less than 400 nm and not more than 1500 nm.

7. The method for manufacturing a solar cell according to claim 1,
wherein in the opening formation step, at least a part of the removal-target body is removed by the irradiation by the laser beam, and
in the plating step, the metal layer is formed so as to be in direct contact with a surface of the first electrode.

8. A method for manufacturing a solar cell module including a solar cell having at least a first electrode, a metal layer, and an insulating layer on a first main surface side of a photoelectric conversion part extending in a planar state, the first main surface side of the photoelectric conversion part comprising a transparent electrode layer, the method comprising the steps of:
a laminated electrode layer formation step of forming on the transparent electrode layer a laminated electrode layer comprising the first electrode and a removal-target body positioned above the first electrode, in this order;
an insulating layer formation step of forming the insulating layer over the transparent electrode layer and the electrode layer positioned above the transparent electrode layer so as to cover at least the removal-target body;
an opening formation step of forming an opening in the insulating layer by removing at least a portion of the removal-target body and a portion of the insulating layer positioned above the removal-target body so as to expose the first electrode; and
a metal layer formation step of forming the metal layer over the first electrode layer so as to fill in the opening in the insulating layer by a plating method, in this order, wherein
in the opening formation step, at least a portion of the removal-target body is removed by irradiation by a laser beam, so that the opening in the insulating layer is formed; and
a solar-cell using step of using the solar cell.

* * * * *